(12) United States Patent
Park et al.

(10) Patent No.: US 10,111,321 B2
(45) Date of Patent: Oct. 23, 2018

(54) PRINTED CIRCUIT BOARD

(71) Applicant: Samsung Electronics Co., Ltd., Gyeonggi-do (KR)

(72) Inventors: Sung-Won Park, Gyeonggi-do (KR); Dong-Kyun Yu, Busan (KR); Ji-Heon Yu, Gyeonggi-do (KR); Seung-Yup Lee, Gyeonggi-do (KR); Taek-Kyun Choi, Gyeongsangbuk-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/045,480

(22) Filed: Feb. 17, 2016

(65) Prior Publication Data

US 2016/0242291 A1 Aug. 18, 2016

(30) Foreign Application Priority Data

Feb. 17, 2015 (KR) ........................ 10-2015-0024300

(51) Int. Cl.
*H05K 1/18* (2006.01)
*H05K 1/02* (2006.01)
*H05K 1/11* (2006.01)

(52) U.S. Cl.
CPC . *H05K 1/0259* (2013.01); *H05K 2201/10015* (2013.01)

(58) Field of Classification Search
CPC ...... H05K 1/0259; H05K 1/182; H05K 1/115; H05K 1/0298; H05K 2201/10015
USPC ........................................................ 174/260
See application file for complete search history.

(56) References Cited

U.S. PATENT DOCUMENTS

| 2005/0108874 | A1 | 5/2005 | Lee et al. | |
| 2008/0217049 | A1* | 9/2008 | Dudnikov | H01G 4/06 174/260 |
| 2008/0251285 | A1* | 10/2008 | Sato | H01G 4/232 174/260 |
| 2009/0128993 | A1* | 5/2009 | Wu | H01G 4/232 361/329 |
| 2012/0230377 | A1* | 9/2012 | Jenwatanavet | H01Q 1/085 375/222 |
| 2014/0003012 | A1 | 1/2014 | Lee et al. | |
| 2016/0381797 | A1* | 12/2016 | Zhou | H01G 4/30 174/251 |

FOREIGN PATENT DOCUMENTS

| KR | 1994-0020440 A | 9/1994 |
| KR | 10-2005-0040588 A | 5/2005 |
| KR | 10-2005-0049043 A | 5/2005 |
| KR | 10-0882266 B1 | 2/2009 |
| KR | 10-2014-0003955 A | 1/2014 |

* cited by examiner

*Primary Examiner* — Timothy Thompson
*Assistant Examiner* — Charles Pizzuto
(74) *Attorney, Agent, or Firm* — Cha & Reiter, LLC.

(57) ABSTRACT

Various embodiments related to a printed circuit board in which a capacitor is embedded are described. The capacitor may include: a plurality of first conductive layers that have a plurality of first via holes; a plurality of second conductive layers that have a plurality of second via holes, wherein the first and second conductive layers are alternately arranged in turns; and a plurality of dielectric layers that are arranged between the first and second conductive layers. Other various embodiments are possible.

18 Claims, 16 Drawing Sheets

PRINTED CIRCUIT BOARD

CLAIM OF PRIORITY

This application claims the priority under 35 U.S.C. § 119(a) to Korean Application Serial No. 10-2015-0024300, which was filed in the Korean Intellectual Property Office on Feb. 17, 2015, the entire content of which is hereby incorporated by reference.

BACKGROUND

The present disclosure relates to a printed circuit board in which a capacitor is embedded.

If a mobile terminal, such as a portable electronic device, includes a rechargeable battery pack, a separate charging device may supply electrical energy to charge the battery pack.

A Y-cap between a primary AC ground and a secondary DC ground in a charging device can be used to reduce electro-magnetic interference during the charging operation. If a printed circuit board includes a Y-cap an AC voltage of 220 V at 60 Hz passes through the Y-cap.

Here, the electro-magnetic interference can generate noise in the electronic device and that may be harmful to the human body. Electro-magnetic waves may be useful for radio communication and radars. However, electro-magnetic interference and the noise generated by the electro-magnetic interference reduce the quality of the operation of the electronic device.

If a connector of the electronic device is mounted on the printed circuit board, and a charging device is electrically connected to the connector through a cable, the connector supplies a current from the charging device to a battery pack of the electronic device in order to charge the battery pack.

However, a current of the charging device can leaked to the printed circuit board, and the leakage current may cause damage to an electronic component and electrically shock a user.

For example, the leakage current may electrically shock a user when the user makes contact with the electronic device, generating an electro-static discharge (ESD). In an ESD, current passes the electrical resistance of the user. The electro-static discharge (ESD) may significantly damage an electronic component circuit of the printed circuit board.

Accordingly, a plurality of prevention caps in the printed circuit board can prevent damage to an electronic component by the electro-static discharge (ESD).

The prevention cap can interrupt the electro-static discharge, prevent an electric shock current, and improve RF radiation characteristics as well.

SUMMARY

However, the prevention cap of the printed circuit board, according to the related art, may be damaged by an electro-static discharge, and accordingly, an electric shock accident may be caused by an electric shock current generated in the printed circuit board and the RF performance of the electronic device may be lowered by the deterioration of the RF performance.

When several prevention caps are provided in the printed circuit board, manufacturing costs of the product increase and an installation space of the printed circuit board is restricted. That is, the space of the circuit board becomes narrower due to the plurality of prevention caps of the printed circuit board.

As a result, a device for providing a capacitor that can interrupt an electro-static discharge (ESD), prevent an electric shock current, and prevent the deterioration of the RF characteristic instead of an existing prevention cap in a printed circuit board in an embedded form has been required.

Therefore, the present disclosure provides a printed circuit board that is provided in an electronic device, in which a capacitor in which a plurality of first and second conductive layers that have a plurality of first and second via holes are arranged in the interior of the printed circuit board, and by which: an electric shock accident of the user can be prevented by preventing the generation of an electric shock current of the printed circuit board; damage to an electronic component provided in the printed circuit board can be prevented by interrupting an electro-static discharge (ESD); RF characteristics can be improved by preventing the deterioration of the RF performance of an antenna unit provided in the printed circuit board; material costs of the printed circuit board can be reduced due to the plurality of existing prevention caps for preventing an electric shock current, interrupting an electro-static discharge (ESD), and preventing the deterioration of RF characteristics of the printed circuit board is not necessary; manufacturing costs of the product can be reduced; assembly time can be reduced; the spatial utility of the printed circuit board can be improved; the spatial utility of the product can be improved because an installation space for the prevention caps is not necessary in the printed circuit board; the size of the product can be reduced; and slimness and strength can be improved.

The present disclosure also provides a printed circuit board that is provided in an electronic device, in which a capacitor in which a plurality of first and second conductive layers having first and second plating parts are arranged in the interior of the printed circuit board, and by which an electric shock to the user can be prevented by preventing the generation of an electric shock current of the printed circuit board, damage to an electronic component provided in the printed circuit board can be prevented by interrupting an electro-static discharge (ESD), and RF characteristics can be improved by preventing the deterioration of the RF performance of an antenna unit provided in the printed circuit board.

The present disclosure also provides a printed circuit board that is provided in an electronic device, in which a capacitor in which a plurality of first and second conductive layers having a plurality of first and second via holes and a plating part are arranged in the interior of the printed circuit board, and by which an electric shock to the user can be prevented by preventing the generation of an electric shock current of the printed circuit board, damage to an electronic component provided in the printed circuit board can be prevented by interrupting an electro-static discharge (ESD), and RF characteristics can be improved by preventing the deterioration of the RF performance of an antenna unit that is provided in the printed circuit board.

In accordance with an aspect of the present disclosure, there is provided a printed circuit board on which a plurality of electronic components are mounted and in which a capacitor is embedded, the printed circuit board including: a plurality of first conductive layers that have a plurality of first via holes; a plurality of second conductive layers that have a plurality of second via holes, wherein the first and second conductive layers are alternately arranged in turns; and a plurality of dielectric layers that are arranged between the first and second conductive layers.

In accordance with another aspect of the present disclosure, there is provided a printed circuit board on which a plurality of electronic components are mounted and in which a capacitor is embedded, the printed circuit board including: a plurality of first conductive layers that have a first plating part and are electrically connected to each other by the first plating part; a plurality of second conductive layers that have a second plating part and are electrically connected to each other by the second plating part, wherein the first and second conductive layers are alternately arranged in turns; and a plurality of dielectric layers that are arranged between the first and second conductive layers.

In accordance with another aspect of the present disclosure, there is provided a printed circuit board on which a plurality of electronic components are mounted and in which a capacitor is embedded, the printed circuit board including: a plurality of first conductive layers that have a plurality of first via holes on one side thereof and have a plating part on an opposite thereof; a plurality of second conductive layers that have a plurality of second via holes on one side thereof, wherein the first and second conductive layers are alternately arranged in turns; and a plurality of dielectric layers that are arranged between the first and second conductive layers.

In accordance with another aspect of the present disclosure, there is provided a printed circuit board on which a plurality of electronic components are mounted and in which a capacitor is embedded, the printed circuit board including: a plurality of first conductive layers that have a plurality of first via holes on one side thereof and have a plating part on the opposite thereof; a plurality of second conductive layers that have a plurality of via holes on one side thereof; and a plurality of dielectric layers that are arranged between the first and second conductive layers, and wherein the first and second conductive layers are alternately arranged in turns or the first conductive layers are continuously arranged between the second conductive layers, and the first and second conductive layers are alternately arranged in turns or the second conductive layers are continuously arranged between the first conductive layer.

In accordance with another aspect of the present disclosure, there is provided a printed circuit board on which a plurality of electronic components are mounted and in which a capacitor is embedded, the printed circuit board including: a plurality of first conductive layers; a plurality of second conductive layers; and a plurality of dielectric layers that are arranged between the first and second conductive layers, and wherein the first and second conductive layers are alternately arranged in turns or the first conductive layers are continuously arranged between the second conductive layers, and the first and second conductive layers are alternately arranged in turns or the second conductive layers are continuously arranged between the first conductive layer.

According to various embodiments of the present disclosure, a capacitor in which a plurality of first and second conductive layers having a plurality of first and second via holes that are arranged in the interior of a printed circuit board is formed, and a capacitor in which a plurality of first and second conductive layers having first and second plating parts that are arranged in the interior of a printed circuit board is formed. This is so that an electric shock to the user can be prevented by preventing the generation of an electric shock current of the printed circuit board, damage to an electronic component provided in the printed circuit board can be prevented by interrupting an electro-static discharge (ESD), and RF characteristics can be improved by preventing the deterioration of the RF performance of an antenna unit. Accordingly, the performance of the electronic device can be improved.

Furthermore, material costs of the printed circuit board can be reduced, manufacturing costs of the product can be reduced, and assembly time can be reduced due to the plurality of existing prevention caps for preventing an electric shock current, interrupting an electro-static discharge (ESD), and preventing the deterioration of RF characteristics of the printed circuit board is not necessary. Also, the spatial utility of the product can be improved by eliminating the installation space for the prevention caps, and slimness and strength of the product can be improved by reducing the size of the printed circuit board.

In addition, an electronic device, in which a capacitor in which a plurality of first and second conductive layers having first and second plating parts are arranged in the interior of the printed circuit board so that an electric shock to the user can be prevented by preventing generation of an electric shock current of the printed circuit board, damage to an electronic component provided in the printed circuit board can be prevented by interrupting an electro-static discharge (ESD), and RF characteristics can be improved by preventing the deterioration of the RF performance of an antenna unit provided in the printed circuit board.

BRIEF DESCRIPTION OF THE DRAWINGS

The above and other aspects, features, and advantages of the present disclosure will be more apparent from the following detailed description taken in conjunction with the accompanying drawings, in which.

DETAILED DESCRIPTION

Figure 1:
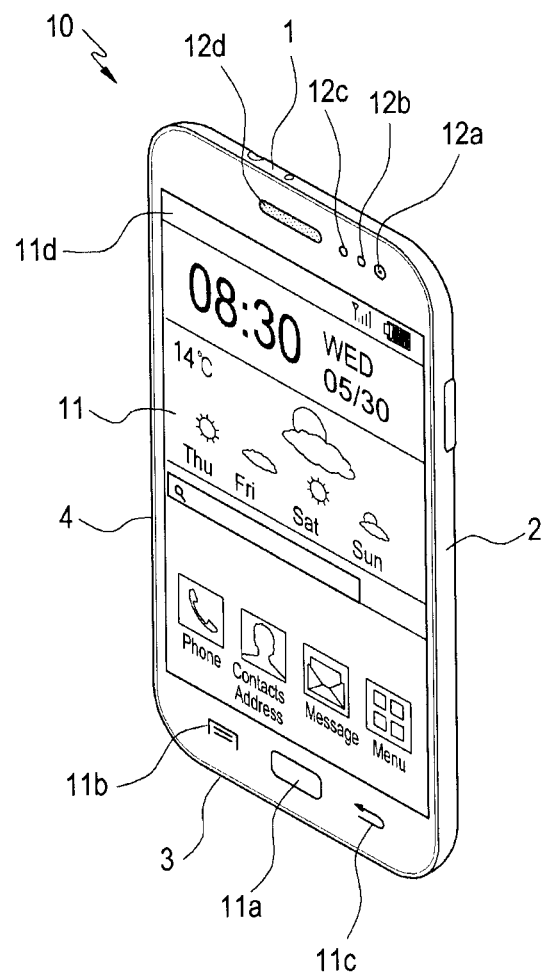
FIG. 1 is a perspective view illustrating a front surface of an electronic device including a printed circuit board in which a capacitor is embedded according to various embodiments of the present disclosure.

Hereinafter, various embodiments of the present disclosure will be described in detail. Firstly, terms used in the various embodiments of the present disclosure will be briefly described.

With respect to the terms in the various embodiments of the present disclosure, the general terms which are currently and widely used are selected in consideration of functions of structural elements in the various embodiments of the present disclosure. However, meanings of the terms may be changed according to an inventor's intention, a judicial precedent, appearance of a new technology, and the like. Further, in a certain case, a term arbitrarily selected by the applicant may be used. In such a case, the meaning of the term will be described in detail at the corresponding part in the description of the present disclosure. Thus, the terms used in various embodiments of the present disclosure should be defined based on the meanings of the terms and the overall contents of the embodiments of the present disclosure instead of simple titles of the terms.

Although the terms including an ordinal number such as first, second, etc. can be used for describing various elements, the structural elements are not restricted by the terms. The terms are used merely for the purpose to distinguish an element from the other elements. For example, a first element could be termed a second element, and similarly, a second element could be also termed a first element without departing from the scope of the present disclosure.

First, application examples of the electronic device, according to an embodiment of the present disclosure, may include not only all mobile communication terminals operating based on communication protocols corresponding to various communication systems but also all information communication devices, multimedia devices, and application devices thereof, such as a video telephone, an e-book reader, a laptop personal computer (PC), a netbook computer, a personal digital assistant (PDA), a portable multimedia player (PMP), an MPEG-1 audio layer-3 (MP3) player, a mobile medical device, a camera, a wearable device (e.g., a head mounted device (HMD) such as electronic glasses, electronic clothing, an electronic bracelet, an electronic necklace, an electronic accessory, an electronic tattoo, or a smart watch), and the like.

According to some embodiments, the electronic device may be a smart home appliance. For example, the smart home appliance may include at least one of a television, a digital video disk (DVD) player, an audio, a refrigerator, an air conditioner, a vacuum cleaner, an oven, a microwave oven, a washing machine, an air cleaner, a set-top box, a TV box (e.g., Samsung HomeSync™, Apple TV™, or Google TV™), a game console, an electronic dictionary, an electronic key, a camcorder, and an electronic photo frame.

According to another embodiment, the electronic devices may include at least one of various medical devices {e.g., a magnetic resonance angiography (MRA), a magnetic resonance imaging (MRI), a computed tomography (CT) machine, and an ultrasonic machine}, navigation devices, global positioning system (GPS) receivers, event data recorders (EDR), flight data recorders (FDR), vehicle infotainment devices, electronic devices for ships (e.g., navigation devices for ships, and gyro-compasses), avionics, security devices, automotive head units, robots for home or industry, automatic teller's machines (ATMs) in banks, or point of sales (POS) in shops.

According to some embodiments, the electronic device may include at least one of furniture or a part of a building/structure, an electronic board, an electronic signature receiving device, a projector, and various types of measuring devices (for example, a water meter, an electric meter, a gas meter, a radio wave meter and the like) including a camera function.

An electronic device according to various embodiments of the present disclosure may be a combination of one or more of above described various devices. Also, an electronic device according to various embodiments of the present disclosure may be a flexible device. Also, an electronic device according to various embodiments of the present disclosure is not limited to the above described devices.

Figure 2:
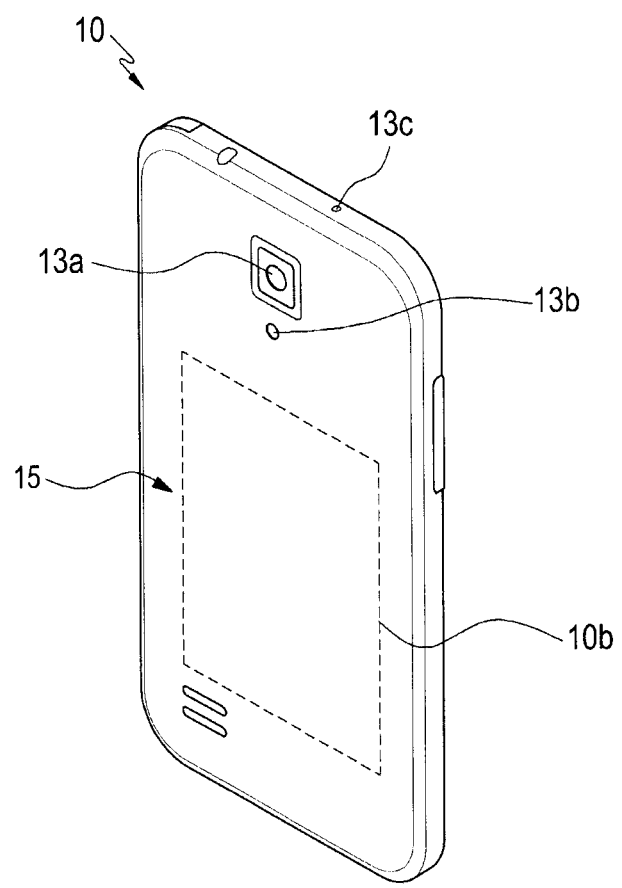
FIG. 2 is a perspective view illustrating a rear surface of an electronic device including a printed circuit board in which a capacitor is embedded according to various embodiments of the present disclosure.

FIG. 1 is a perspective view illustrating a front surface of an electronic device. FIG. 2 is a perspective view illustrating a rear surface of the electronic device. The electronic device 10 may be a smartphone or a wearable device. A configuration of an electronic device, such as a smartphone, will be described with reference to FIGS. 1 and 2.

As illustrated in FIG. 1, a touch screen 11 may be arranged at the center of the front surface of the electronic device 10. The touch screen 11 may occupy most of the front surface of the electronic device 10. FIG. 1 illustrates an example of displaying a main home screen on the touch screen 11. The main home screen is the first screen that is displayed on the touch screen 11 when the electronic device 10 is powered on. When the electronic device 10 has different home screens corresponding to several pages, the main home screen may be the first home screen of the home screens of the several pages. Shortcut icons used for executing frequently used applications, a main menu switching key, time, weather, and the like may be displayed on the main home screen. The main menu switching key may display a menu screen on the touch screen 11. A status bar 11d for displaying statuses, such as a battery charging status, the intensity of a received signal, and the current time, may also be formed at an upper end of the touch screen 11. A home key 11a, a menu button 11b, and a back button 11c may be formed at a lower side of the touch screen 11.

The home key 11a may display the main home screen on the touch screen 11. For example, when the home key 11a is touched while any home screen different from the main home screen or a menu screen is displayed on the touch screen 11, the main home screen may be displayed on the touch screen 11. Furthermore, when the home key 11a is touched while applications are being executed on the touch screen 11, the main home screen may be displayed on the touch screen 11. Also, the home button 11a may also be used to display recently used applications or to display a task manager on the touch screen 11. The menu button 11b may provide a connectivity menu that may be used on the touch screen 11. The connectivity menu may include a widget addition menu, a background switching menu, a search menu, an edition menu, and an environment setting menu. The back button 11c may display a screen that is executed shortly before the currently executed screen, or may terminate the most recently used application.

According to various embodiments of the present disclosure, a first camera 12a, an illumination intensity sensor 12b, or a proximity sensor 12c may be disposed on an upper end portion of the front surface of the electronic device 10. A second camera 13a, a flash 13b, or a speaker 13c may be provided on the rear surface of the electronic device 10. If the electronic device 10 is configured such that a battery pack is detachable from the electronic device 10, a bottom surface of the electronic device 10 may act as a detachable battery cover 15.

The electronic device 10 that will be described below may be any one of a wearable device, a notebook, a netbook, a smartphone, a tablet PC, a galaxy tab, and an i-Pad. In the embodiment of the present disclosure, the electronic device 10 may be a smartphone.

Figure 3:
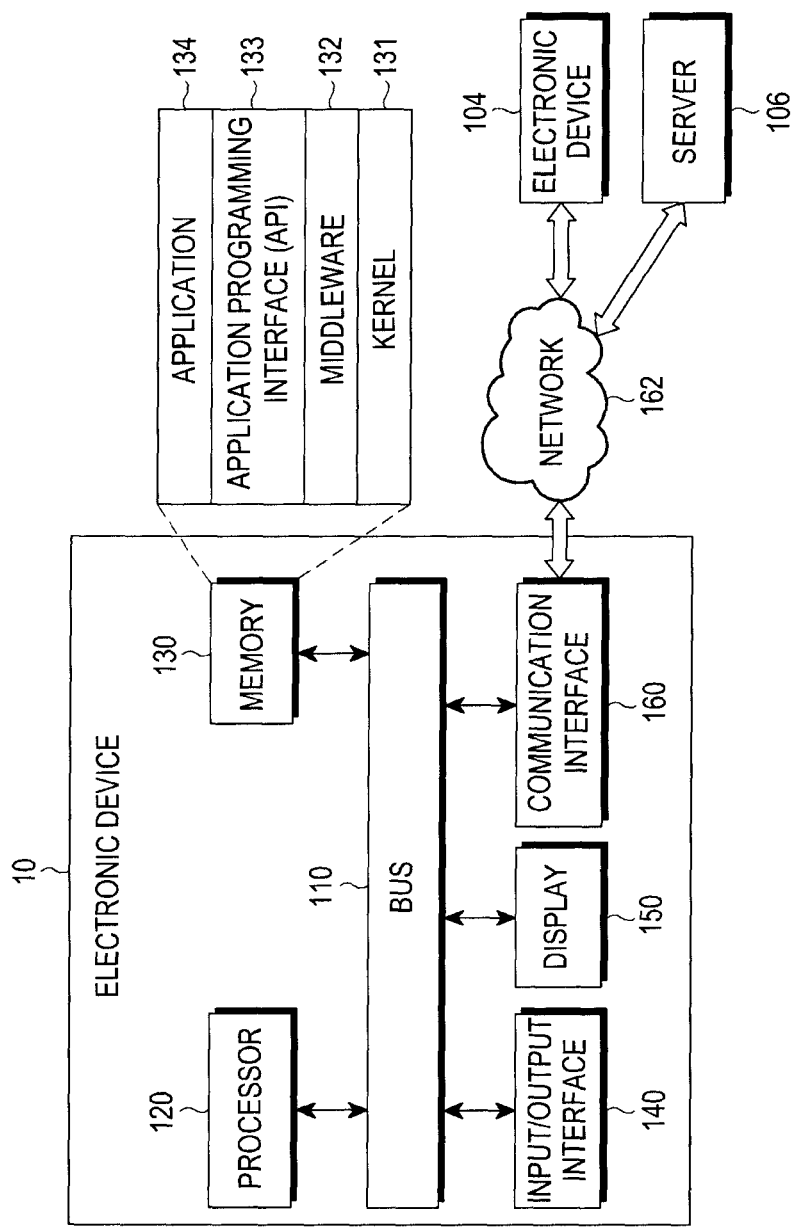
FIG. 3 is a block diagram illustrating a network environment including an electronic device according to various embodiments of the present disclosure.

FIG. 3 illustrates a network environment including an electronic device 101 according to various embodiments of the present disclosure.

Referring to FIG. 3, the electronic device 10 may include a bus 110, a processor 120, a memory 130, an input/output interface 140, a display unit 150, and a communication interface 160. The bus 110 may be a circuit that connects elements of the electronic device 10 and transfers communication (for example, a control message) between the elements.

The processor 120 may, for example, receive commands from the other elements (for example, the memory 130, the input/output interface 140, the display unit 150, and the communication interface 160) through the bus 110, decode the received commands, and may execute operations or data processing according to the decoded commands.

The memory 130 may store commands or data that are received from, or generated by the processor 120 or the other elements (for example, the input/output interface 140, the display unit 150, and the communication interface 160). The memory 130 may include, for example, programming modules, such as a kernel 131, middleware 132, an Application Programming Interface (API) 133, and applications 134. The programming modules may include software, firmware, hardware, or a combination of two or more thereof.

The kernel 131 may control or manage system resources (for example, the bus 110, the processor 120, and the memory 130) that are used to execute operations or functions implemented in the other programming modules, for example, the middleware 132, the API 133, and the applications 134. The kernel 131 may provide an interface through which the middleware 132, the API 133, or the applications 134 access individual elements of the electronic device 10 to control or manage the elements.

The middleware 132 may function as an intermediary that allows the API 133 or the applications 134 to communicate with the kernel 131 to exchange data. In relation to task requests received from the applications 134, the middleware 132 may, for example, execute a control (for example, scheduling or load balancing) for the task requests using a method of assigning a priority to use system resources of the electronic device 10 (for example, the bus 110, the processor 120, and the memory 130) to at least one of the applications 134.

The API 133 is an interface used, by the application 134, to control a function provided from the kernel 131 or the middleware 132, and may include, for example, at least one interface or function (for example, an command) for file control, window control, image processing, text control, etc.

According to various embodiments, the applications 134 may include a short message service (SMS)/multimedia message service (MMS) application, an e-mail application, a calendar application, an alarm application, a health care application (for example, an application for measuring a work rate or blood sugar), and an environment information application (for example, an application for providing atmospheric pressure, humidity, or temperature information). Additionally or alternatively, the applications 134 may be an application associated with information exchange between the electronic device 10 and an external electronic device (for example, an electronic device 104). The application associated with the exchange of information may include, for example, a notification relay application for transferring specific information to an external electronic device or a device management application for managing an external electronic device.

For example, the notification relay application may have a function of forwarding, to an external electronic device (for example, the electronic device 104), notification information generated from other applications of the electronic device 10 (for example, an SMS/MMS application, an e-mail application, a health care application, and an environmental information application). Additionally or alternatively, the notification relay application may, for example, receive notification information from an external electronic device (for example, the electronic device 104) and may provide the received notification information to a user. The device management application may, for example, manage (for example, install, delete, or update) a function for at least a part of an external electronic device (for example, the electronic device 104) communicating with the electronic device 10 (for example, activating/deactivating the external electronic device itself (or some components thereof) or adjusting the brightness (or resolution) of a display), an application operating in the external electronic device, or a service provided from the external electronic device (for example, a telephone call service or a message service).

According to various embodiments, the applications 134 may include an application specified according to an attribute (for example, a type) of an external electronic device (for example, the electronic device 104). For example, when the external electronic device is an MP3 player, the applications 134 may include an application relating to the reproduction of music. Similarly, when the external electronic device is a mobile medical device, the applications 134 may include an application relating to health care. According to an embodiment, the applications 134 may include at least one of the applications specified to the electronic device 10 or applications received from an external electronic device (for example, a server 106 or the electronic device 104).

The input/output interface 140 may forward commands or data input by a user through an input/output device (for example, a sensor, a keyboard, or a touch screen) to the processor 120, the memory 130, and the communication interface 160 through the bus 110. For example, the input/output interface 140 may provide the processor 120 with data corresponding to a user touch input through a touch screen. The input/output interface 140 may, for example, output commands or data received through the bus 110 from the processor 120, the memory 130, and the communication interface 160, through an input/output device (for example, a speaker or display). The input/output interface 140 may include an audio module.

The display unit 150 may display various types of information (for example, multimedia data or text data) to a user.

The communication interface 160 may connect communication between the electronic device 10 and an external device (for example, the electronic device 104 or the server 106). For example, the communication interface 160 may be connected to a network 162 through wireless or wired communication to communicate with the external device. The wireless communication may include, for example, at least one of wireless fidelity (Wi-Fi), Bluetooth (BT), near field communication (NFC), a global positioning system (GPS), and cellular communication (for example, LTE, LTE-A, CDMA, WCDMA, UMTS, WiBro, GSM, etc,). The wired communication may include at least one of, for example, a universal serial bus (USB), a high definition multimedia interface (HDMI), recommended standard 232 (RS-232), and a plain old telephone Service (POTS).

According to an embodiment, the network 162 may be a telecommunication network. The telecommunication network may include at least one of a computer network, the Internet, Internet of Things, and a telephone network. According to an embodiment, a protocol for communication between the electronic device 10 and an external device (for example, a transport layer protocol, a data link layer protocol, or a physical layer protocol) may be supported by at least one of the applications 134, the API 133, the middleware 132, the kernel 131, and the communication interface 160.

According to various embodiments, a controller may include the processor 120 and the memory 130 for storing information required by the processor 120. The controller is a central processing unit that controls the overall operations of the electronic device 10.

In certain embodiments, the processor 120 and memory 130 can be integrated circuits that are soldered onto a printed circuit board. The communication interface 160 can include an antenna connected to the printed circuit board. The display unit 150 and the input/output interface 140 can be connected to the printed circuit board by wires that are soldered onto the printed circuit board and connected to the display unit 150 and/or input/output interface 140. The bus include printed connections between the various integrated circuits, antenna, and connecting wires.

The battery pack provided in the electronic device of the present disclosure receives electric power through an external charging device to be charged. For example, a connector provided in the printed circuit board of the electronic device and the external charging device are electrically connected to each other through a cable.

Figure 4:
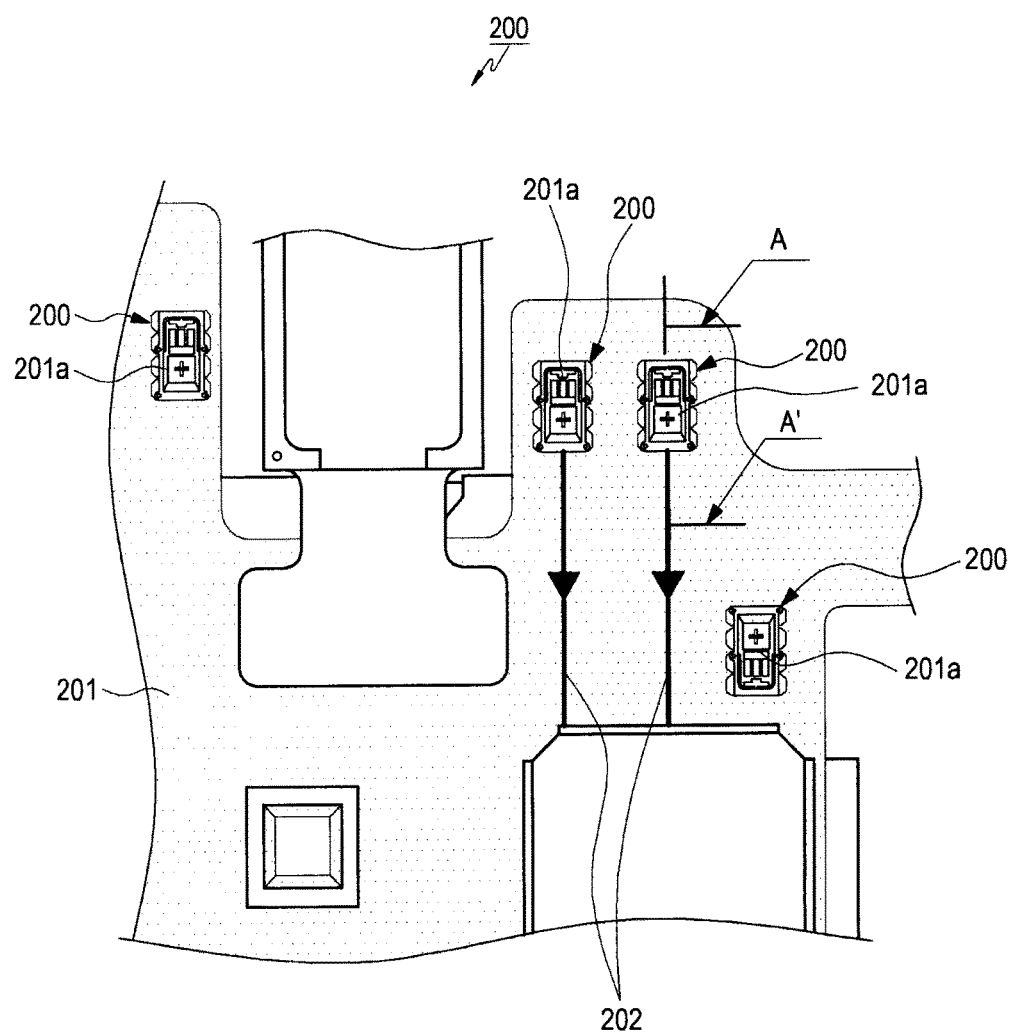
FIG. 4 is a plan view illustrating a printed circuit board in which a capacitor is embedded according to various embodiments of the present disclosure.
Figure 5:
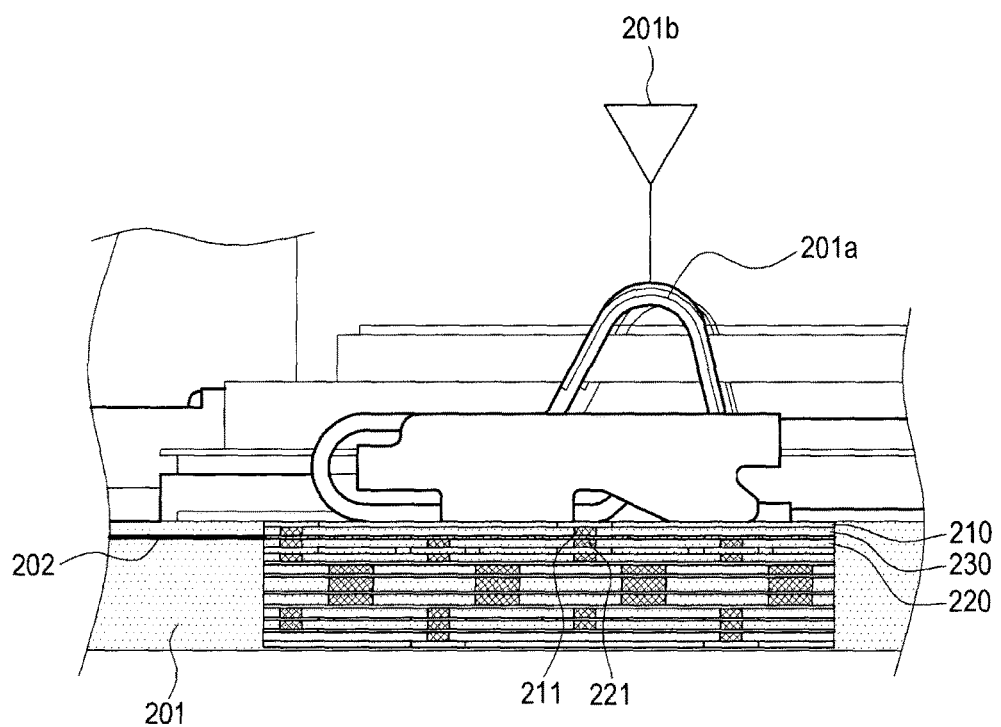
FIG. 5 is a sectional view taken along line A-A' of FIG. 4.
Figure 6:
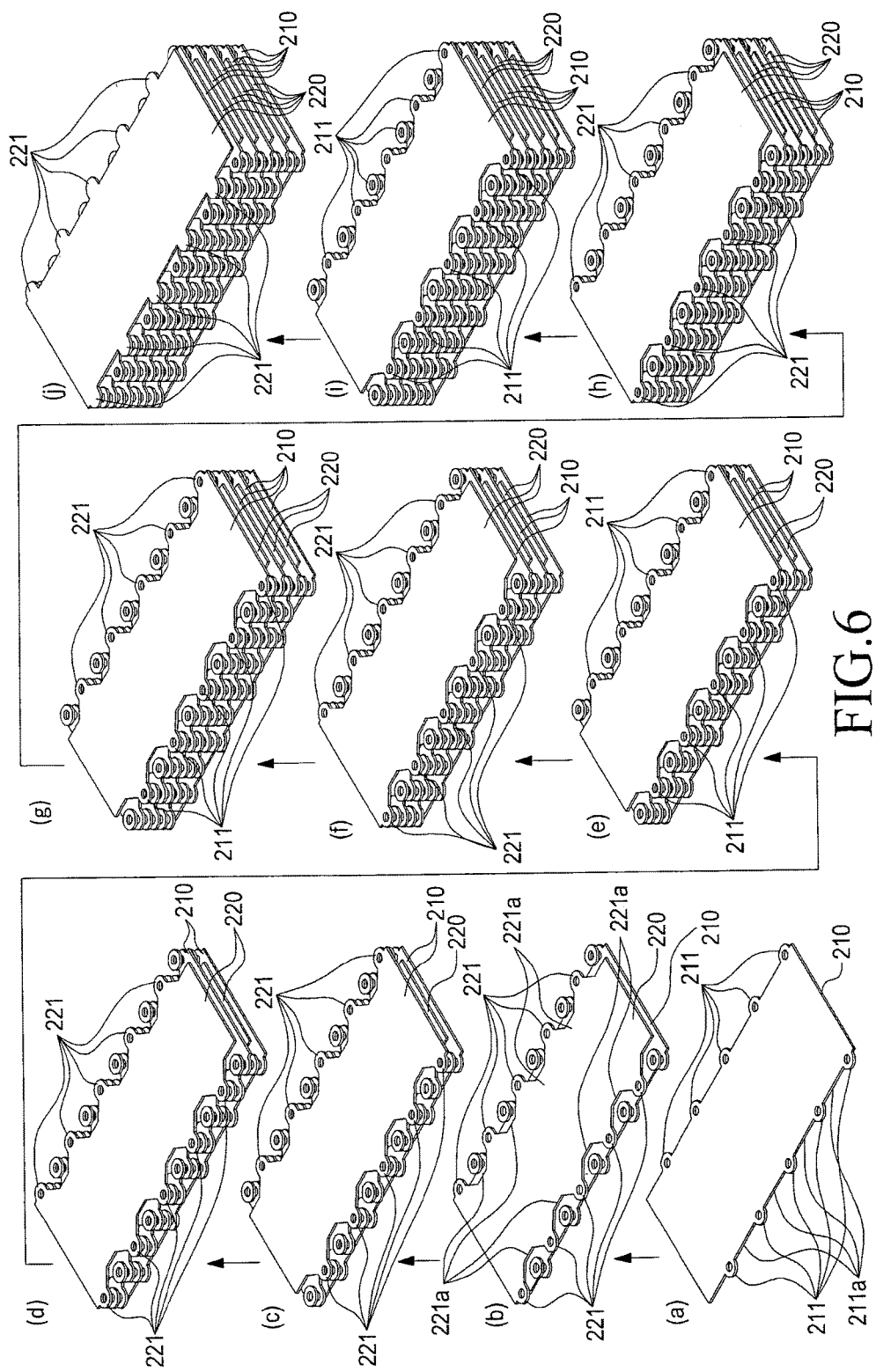
FIG. 6 is a perspective view illustrating a process of manufacturing a printed circuit board in which a capacitor is embedded according to various embodiments of the present disclosure.

FIG. 4 is a plan view illustrating a printed circuit board 201 in which a capacitor 200 is embedded according to various embodiments ('a first embodiment') of the present disclosure. FIG. 5 is a sectional view taken along line A-A' of FIG. 4. FIG. 6 is a perspective view illustrating first and second conductive layers 210 and 220 of a printed circuit board 201 in which a capacitor 200 is embedded according to various embodiments of the present disclosure.

As illustrated in FIG. 4, the capacitor, according to various embodiments of the present disclosure, may be embedded in a printed circuit board PCB on which other electronic components provided in the electronic device 10 (see FIG. 1) are mounted. That is, the capacitor 200 may be variously mounted onto any circuit board on which electronic components are mounted. For example, the capacitor 200 may also be applied to a flexible printed circuit board (FPCB).

In more detail, referring to FIGS. 4 to 6, the capacitor 200 embedded in the printed circuit board 201 includes a plurality of first and second conductive layers 210 and 220 and a plurality of dielectric layers 230.

The first conductive layers 210 are arranged along a longitude direction, and the first conductive layers 210 may be arranged between the second conductive layers 220, which will be described below, and the first conductive layers 210 and the second conductive layers 220 may be alternately arranged in turns. A plurality of first vias 211 may be formed to electrically connect the first conductive layers 210. The second conductive layers 220 are arranged along a longitude direction, the second conductive layers 220 may be arranged between first conductive layers 210, in an alternating fashion. A plurality of second via holes 221 may be formed to electrically connect successive second conductive layers 220.

The dielectric layers 230 are provided between the first and second conductive layers 210 and 220 such that the first and second conductive layers 210 and 220 are not electrically connected to each other.

In this way, because the capacitor 200 is formed by alternately arranging the plurality of first and second conductive layers 210 and 220 having the plurality of first and second via holes 211 and 221 in the printed circuit board 201 such that the first and second conducive layers 210 and 220 face each other. The capacitor 200 prevents an electric shock to the user by preventing the generation of an electric current by the electronic device by the capacitor 200. This prevents damage to the electronic component 201a provided in the printed circuit board 201 can be prevented by preventing generation of an electro-static discharge, and RF radiation characteristics can be improved by preventing the deterioration of the RF performance of an antenna unit 201b provided in the printed circuit board 201 as well.

One of the plurality of electronic components 201a is arranged at, and electrically connected to, the upper portions of the first and second conductive layers 210 and 220.

The electronic component 201a may include an antenna clip 201a electrically connected to the antenna unit 201b provided in the electronic device. The antenna clip 201a will be described as an example of the electronic component 201a, but the present disclosure is not limited thereto. That is, the electronic component 201 may include other electronic components 201a provided in the printed circuit board 201. For example, the electronic component 201a may be a connector or a switch device.

The antenna 201a may be any one of a C-clip, a plate spring, and a pogo spring. The antenna clip 201a may be another clip 201a other than the disclosed clip 201a.

The first and second conductive layers 210 and 220 may be formed of a metal material. A metal material will be described as an example of the material of the first and second conductive layers 210 and 220, but the present disclosure is not limited thereto. That is, in addition to a metal material, any material that is electrically conductive maybe variously applied as the material of the first and second conductive layers 210 and 220.

The first and second conductive layers 210 and 220 may be electrically connected to any one of a plurality of signal wires and a plurality of grounds.

The first and second via holes 211 and 221 may be formed along the perimeters of the first and second conductive layers 210 and 220, and the first and second via holes 211 and 221 may be arranged in spaces 211a and 221a formed between the first and second via holes 211 and 221.

For example, as illustrated in FIGS. 6A to 6J, which have been mentioned above, the first and second conductive layers 210 and 220 are arranged in a longitude direction. Then, because the plurality of first via holes 211 are formed at the perimeter of the first conductive layer 210 and the spaces 211a are formed between the first via holes 211, the second via holes 221 of the second conductive layer 220 are arranged in the spaces 211a of the first via holes 211. Similarly the plurality of second via holes 221 are formed at the circumference of the second conductive layer 220 and the spaces 221a are formed between the second via holes 221, the first via holes 211 of the first conductive layer 210 are arranged in the spaces 221a of the second via holes 221.

Accordingly, the first conductive layers 210 are electrically connected to each other by the first via holes 211 but insulated from the second conductive layers 220 by dielectric layers 230. Likewise, and the second conductive layers 220 are electrically connected to each other by the second via holes 221 but insulated from the first conductive layers 210 by the dielectric layers 230.

Hereinafter, a process of manufacturing the printed circuit board 201 in which the capacitor 200 is embedded will be described with reference to FIGS. 6A to 6J, which have been mentioned above.

First, as illustrated in FIG. 6A, the first conductive layers 210 having the plurality of first via holes 211 are formed on the opposite side surfaces of the printed circuit board 201, and as illustrated in FIG. 6B, the second conductive layers 220 are formed on the first conductive layers 210 in a longitude direction. A plurality of second via holes 221 are formed on the opposite side surfaces of the second conductive layers 220. Then, the second via holes 221 are arranged in the spaces 211a formed between the first via holes 211 of the first conductive layer 210. Similarly, the first via holes 221 are arranged in the spaces 221a formed between the second via holes 211.

To prevent electrical connection between the first conductive layer 210 and the second conductive layer 220, a dielectric layer is placed (not shown) above each one of the first conductive layers 210 and the second conductive layers 220.

As illustrated in FIGS. 6C and 6D, another first conductive layer 210 is placed planarly above the second conductive layer 220, and another second conductive layer 220 is arranged on the another first conductive layer 210.

Then, the other second conductive layer 220 and the other first conductive layer 210 are alternately arranged in turns That is, a second conductive layer 220 is placed planarly above a first conductive layer 210, another first conductive layer 210 is arranged on the second conductive layer 220, and another second conductive layer 220 is sequentially alternately arranged in the longitude direction of another second conductive layer 220.

Similarly, as illustrated in FIGS. 6E and 6J, another first conductive layer 210 is placed planarly above the other second conductive layer 220, and another second conductive layer 220 is arranged on the other first conductive layer 210. Accordingly, the second conductive layers 220 are arranged between the first conductive layers 210 and the first via holes 211 of the first conductive layers 210 electrically connect the first conductive layers 210 at the same time, and the second via holes 221 of the second conductive layers 220 electrically connect the second conductive layer 220.

Ten layers may be arranged such that the first and second conductive layers 210 and 220 are alternately arranged in turns to face each other. More than or less than ten layers of the first and second conductive layers 210 and 220 may be arranged.

Dielectric layers 230 are formed between the first and second conductive layers 210 and 220 to prevent the first and second conductive layers 210 and 220 from being electrically connected to each other.

That is, the dielectric layers 230 prevent electrical connection between the first conductive layer 210 and the second conductive layers 220. The first conductive layers 210 are electrically connected by the first via holes 211, while the second conductive layers are connected by the second via holes 221. According to various embodiments of the present disclosure, an operation of the capacitor 200 embedded in the printed circuit board 201 will be described as follows.

Figure 7:
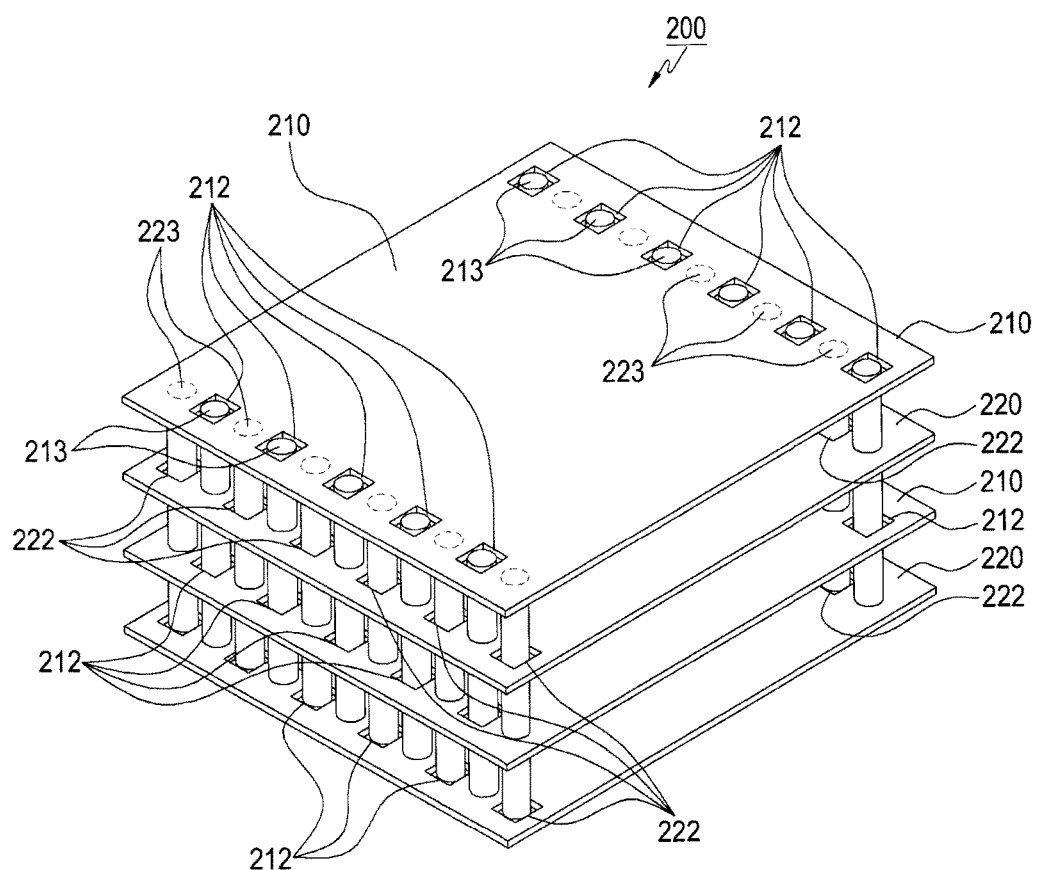
FIG. 7 is a perspective view illustrating a coupling state of first and second conductive layers of a printed circuit board in which a capacitor is embedded according to various embodiments of the present disclosure.
Figure 8:
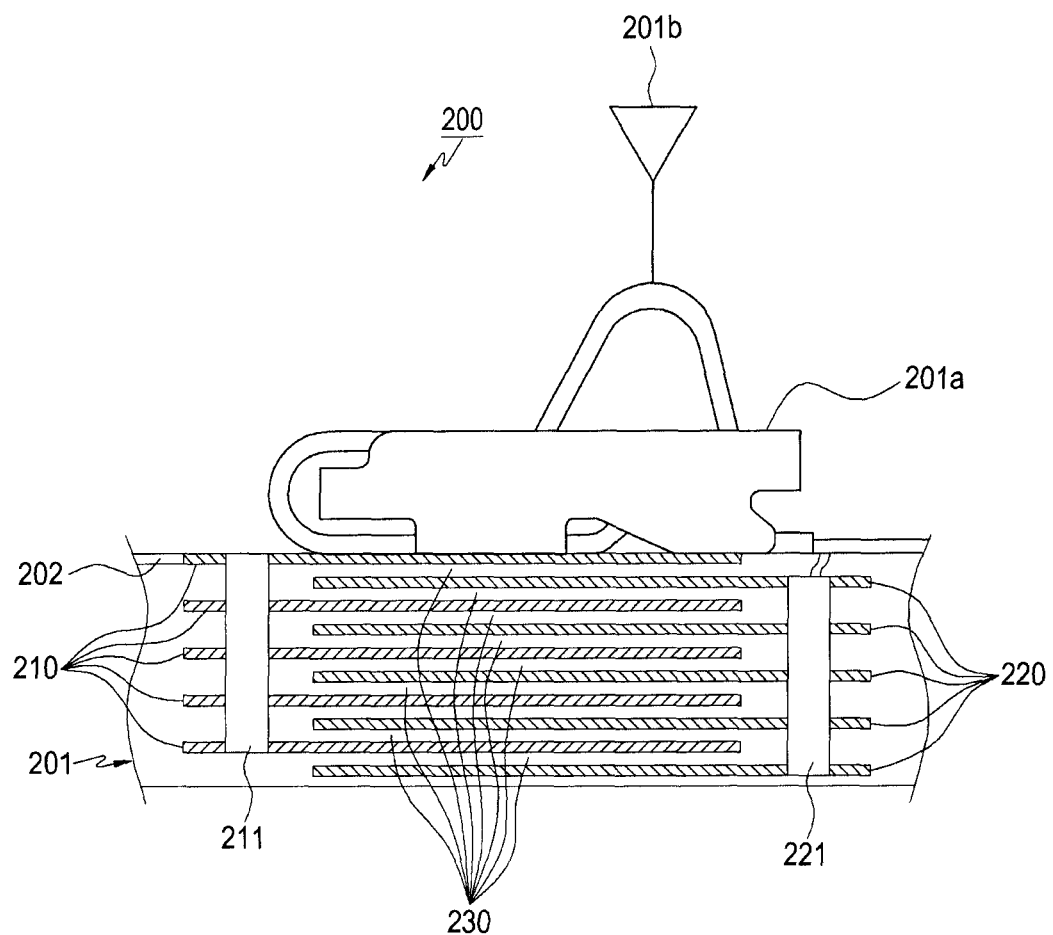
FIG. 8 is a side view illustrating a coupling state of first and second conductive layers of a printed circuit board in which a capacitor is embedded according to various embodiments of the present disclosure.

First, FIG. 7 is a perspective view illustrating a coupling state of the first and second conductive layers 210 and 220 of the capacitor 200 according to the present disclosure. FIG. 8 is a perspective view illustrating the first and second conductive layers 210 and 220 of a printed circuit board 201 in which the capacitor 200 is embedded according to various embodiments of the present disclosure.

As illustrated in FIGS. 7 and 8, an antenna clip 201a is installed on the capacitor 200, which is embedded in the printed circuit board 201. The antenna clip 201a is electrically connected to the first conductive layer 210, forming the capacitor 200. Here, if the second conductive layer 220 is arranged on the capacitor 200, the antenna clip 201a is electrically connected to the second conductive layer 220.

Turning to FIG. 7, there is another embodiment in which the antenna clip 201a is electrically connected to the first and second conductive layers 210 and 220 will be described. In FIG. 7, electrical connections between the first conductive layers 210 pass through the second conductive layers 220. Vias 213 and 223 conduct electric current and pass through holes 212 and 222.

The antenna clip 201a is electrically connected to the antenna unit 201b provided in the electronic device.

That is, the antenna clip 201a is electrically connected to the vias 213 through holes 212 and vias 223 through direct connection to the first conductive layer 210. Through this configuration, the first conductive layers 210 are connected to each other by the vias 223 that are electrically connected to the first conductive layer and pass through holes 222 through the second conductive layer. The second conductive layers 220 are electrically connected by vias 213 that are electrically connected to the second conductive layers 220 and pass through holes 212 through the first conductive layers 210.

The vias 212 and 213 are arranged adjacent to each other and may reduce the magnitude of the currents that flow through the first and second conductive layers 210 and 220, and reduce parasite inductances caused by the currents. Accordingly, an electro-static (ESD) that may be generated in the printed circuit board 201 and the antenna clip 201a can be prevented. Moreover, because the first and second conductive layers 210 and 220 reduce the magnitude of the current that flow in the printed circuit board 201, an electric shock current can be prevented.

Furthermore, the capacitance of the printed circuit board 201 can be enhanced by making the areas of the first and second conductive layers 210 and 220 larger, making the interval between the first and second conductive layers 210 and 220 shorter, and alternately arranging the first and second conductive layers 210 and 220. The first and second conductive layers 210 and 220 increases capacitance to provide a necessary electrical capacitance for the antenna clip 201a, and accordingly, the antenna clip 201a can improve the operation of the antenna unit 201b. The first and second conductive layers 210 and 220 can improve the RF radiation characteristics of the antenna unit 201b.

In the embodiment of the present disclosure, Equation 1 of a capacitance C having an optimum performance in radio frequencies is as follows.

$$C = \frac{A \times \varepsilon_0 \times \varepsilon_r}{d}[F] \qquad \text{Equation 1}$$

Here, A denotes area and d denotes distance.

Moreover, a wire and a ground of the printed circuit board 201 and a mechanical ground are not generated under the capacitor 200 according to the present disclosure. If a wire and a ground of the printed circuit board is generated under the capacitor 200, a parasite inductance is generated and, accordingly, an RF signal may be lost. Accordingly, neither a wire nor a ground is present in a section of the printed circuit board 201 under the capacitor 200.

As illustrated in FIG. 8, which has been mentioned above, the size of one surface of each of the dielectric layers 230 is larger than the sizes of the first and second conductive layers 210 and 220. In other words, when the printed circuit board 201 is manufactured, the dielectric layers 230 are laminated, and the plurality of first and second conductive layers 210 and 220 are laminated at at least a portion of the dielectric layers 230.

Figure 9:
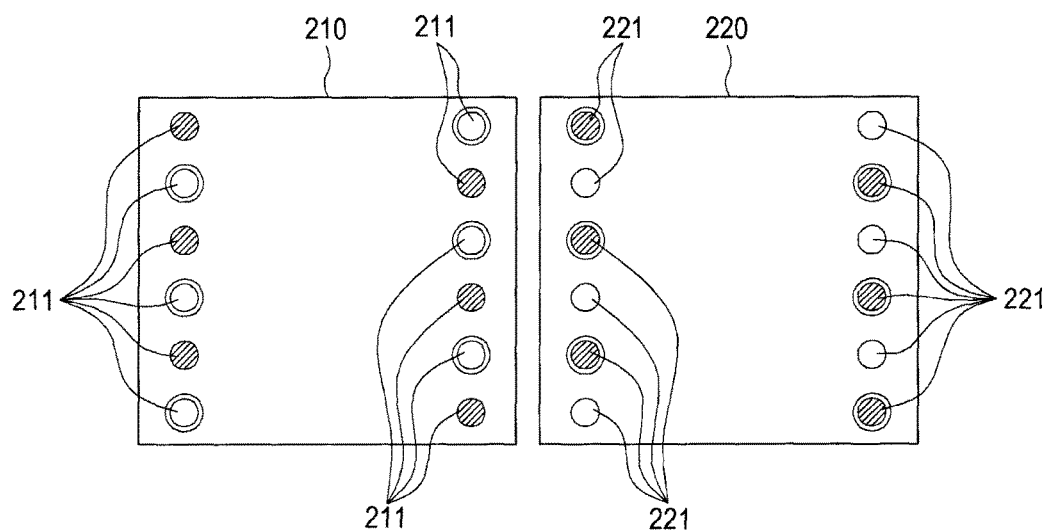
FIG. 9 is a plan view illustrating an arrangement of first and second via holes of first and second conductive layers of a printed circuit board in which a capacitor is embedded according to various embodiments of the present disclosure.

Here, FIG. 9 is a plane view illustrating the first and second via holes 211 and 221 of the first and second conductive layers 210 and 220 of a printed circuit board 201 in which the capacitor 200 is embedded according to various embodiments of the present disclosure.

As illustrated in FIG. 9, the first via holes 211 are arranged in the spaces formed between the second via holes 221 and are arranged along the opposite side surfaces of the first and second conductive layers 210 and 220 so that parasitic inductance can be reduced. The second via holes 221 are arranged in the spaces formed between the first via holes 211 and are arranged along the opposite side surfaces of the first and second conductive layers 210 and 220 so that parasitic inductance can be reduced.

That is, the first and second via holes 211 and 221 are arranged along the opposite side surfaces of the first and second conductive layers 210 and 220, and in this state, the first and second layers 210 and 220 are laminated.

Figure 10:
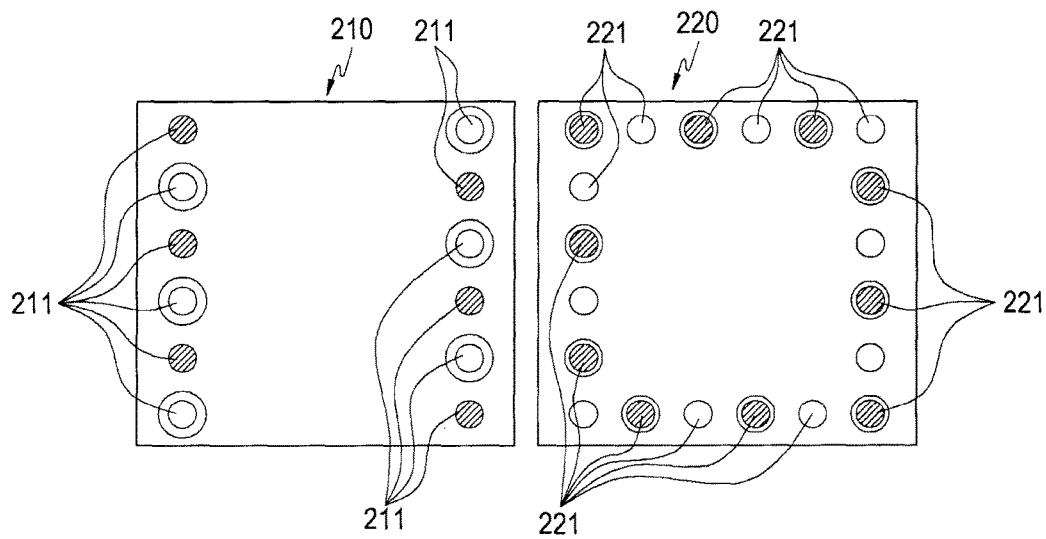
FIG. 10 is a plan view illustrating an embodiment of another arrangement of first and second via holes of first and second conductive layers of a printed circuit board in which a capacitor is embedded according to various embodiments of the present disclosure.

FIG. 10 is a plane view illustrating the first and second via holes 211 and 221 of the first and second conductive layers 210 and 220 of a printed circuit board 201 in which the capacitor 200 is embedded according to another embodiment of the present disclosure.

As illustrated in FIG. 10, the first via holes 211 are arranged along the opposite side surfaces of the first conductive layer 210, and the second via holes 221 are arranged along a perimeter of the shape of the second conductive layer 220.

That is, the first and second conductive layers 210 and 220 in which the first and second via holes 211 and 221 are arranged are alternately arranged to face each other along the longitude direction.

The first and second via holes 211 and 221 can prevent the generation of an electric shock current by further reducing parasitic inductance due to a current, preventing an electro-static discharge (ESD), and reducing the magnitude of the current that flows through the printed circuit board 201.

Figure 11:
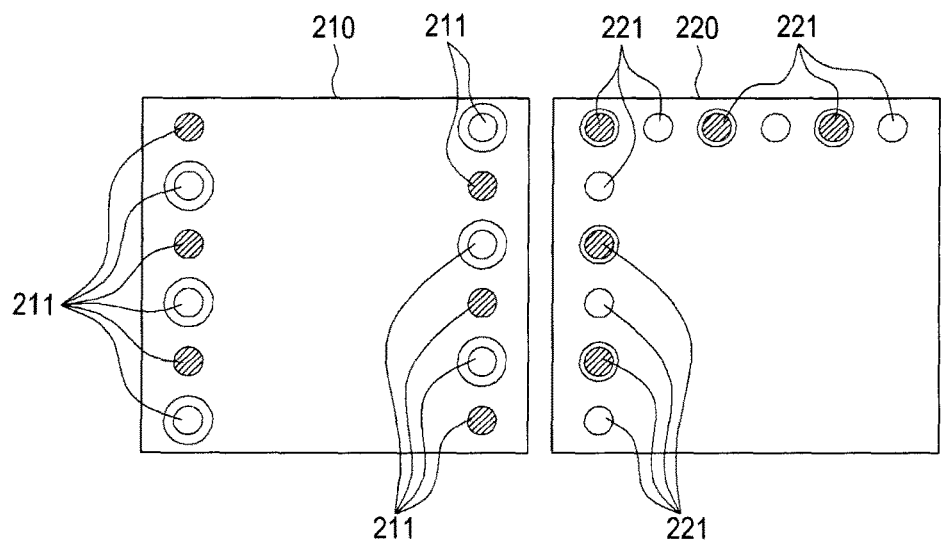
FIG. 11 is a plan view illustrating an embodiment of another arrangement of first and second via holes of first and second conductive layers of a printed circuit board in which a capacitor is embedded according to various embodiments of the present disclosure.

FIG. 11 is a plane view illustrating the first and second via holes 211 and 221 of the first and second conductive layers 210 and 220 of a printed circuit board 201 in which the capacitor 200 is embedded according to another embodiment of the present disclosure.

As illustrated in FIG. 11, the first and second via holes 211 and 221 are arranged along the opposite side surfaces of the first conductive layer 210, and the second via holes 221 are arranged along the vertical and horizontal lines of the second conductive layer 220.

Similarly, the first and second conductive layers 210 and 220, in which the first and second via holes 211 and 221 are arranged, are alternately arranged to face each other along the longitude direction.

The first and second via holes 211 and 221 can further reduce a parasitic inductance due to a current, and can prevent an electro-static discharge of the printed circuit board and may further prevent generation of an electric shock current as well.

Figure 12:
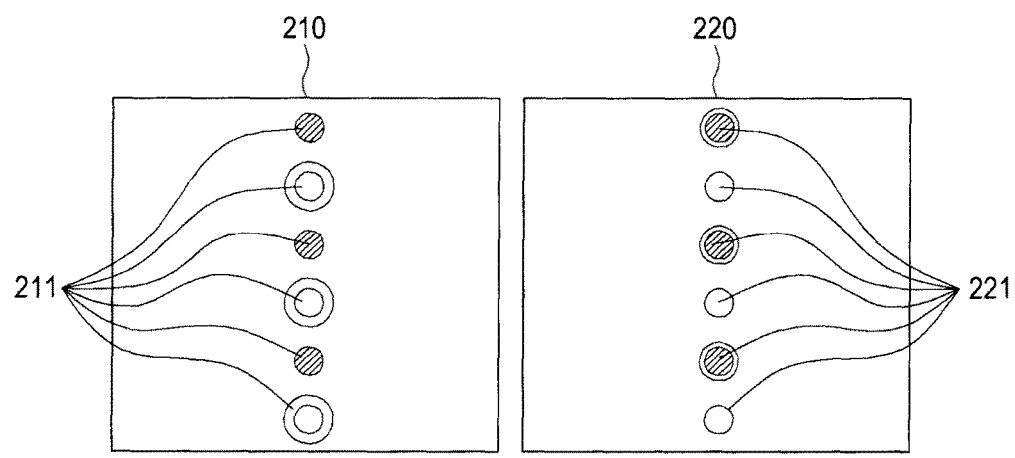
FIG. 12 is a plan view illustrating an embodiment of another arrangement of first and second via holes of first and second conductive layers of a printed circuit board in which a capacitor is embedded according to various embodiments of the present disclosure.

FIG. 12 is a plane view illustrating the first and second via holes 211 and 221 of the first and second conductive layers 210 and 220 of a printed circuit board 201 in which the capacitor 200 is embedded according to another embodiment of the present disclosure.

As illustrated in FIG. 12, the first and second via holes 211 and 221 are arranged at the centers of the first and second conductive layers.

That is, the first and second via holes are arranged in rows along the centers between the opposite side surfaces of the first and second conductive layers.

In this way, the first and second conductive layers 210 and 220, in which the first and second via holes 211 and 221 are arranged, are alternately arranged to face each other along the longitude direction.

The first and second via holes 211 and 221 can further reduce a parasite inductance caused by a current, and can prevent an electro-static discharge of the printed circuit board and further prevent the generation of an electric shock current as well.

Figure 13:
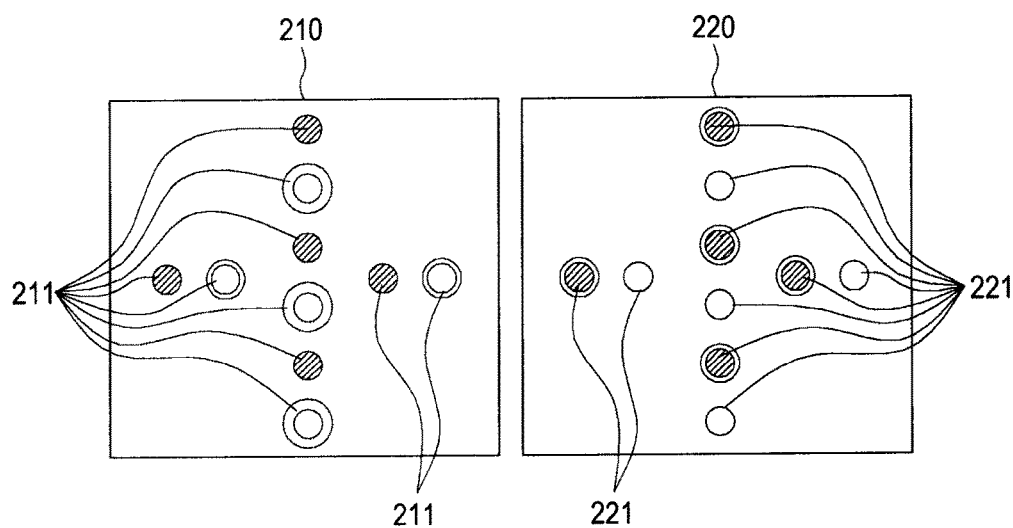
FIG. 13 is a plan view illustrating an embodiment of another arrangement of first and second via holes of first and second conductive layers of a printed circuit board in which a capacitor is embedded according to various embodiments of the present disclosure.

FIG. 13 is a plan view illustrating the first and second via holes 211 and 221 of the first and second conductive layers 210 and 220 of a printed circuit board 201 in which the capacitor 200 is embedded according to another embodiment of the present disclosure.

As illustrated in FIG. 13, the first and second via holes 211 and 221 are arranged in the transverse and longitudinal directions of the first and second conductive layers 210 and 220.

That is, the first via holes 211 are alternately arranged in the transverse and longitudinal directions of the first conductive layer 210. In other words, the first via holes 211 are arranged in a "+" shape.

Similarly, the second via holes 221 are alternately arranged in the transverse and longitudinal directions of the second conductive layer 220. In other words, the second via holes 211 are arranged in a "+" shape.

In another embodiment of the present disclosure, the first and second via holes 211 and 221 may be arranged in another shape other than the "+" shape. For example, the first and second via holes 211 and 221 may be arranged in an "X" shape or a "V" shape.

In this way, the first and second conductive layers 210 and 220, in which the first and second via holes 211 and 221 are arranged, are alternately arranged to face each other along the longitude direction.

The first and second via holes 211 and 221 can further reduce a parasitic inductance caused by a current, and can prevent an electro-static discharge of the printed circuit board and further prevent generation of an electric shock current as well.

Figure 14A:
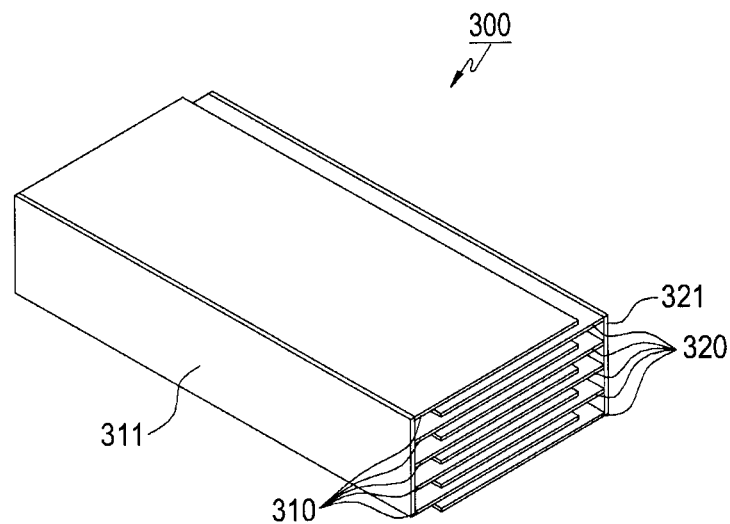
FIG. 14A is a perspective view illustrating a first plating part of a printed circuit board in which a capacitor is embedded according to another embodiment of the present disclosure.
Figure 14B:
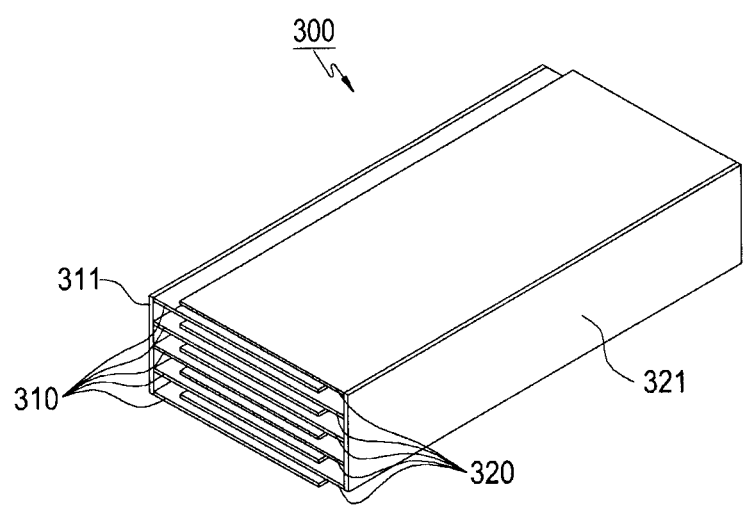
FIG. 14B is a perspective view illustrating a second plating part of a printed circuit board in which a capacitor is embedded according to another embodiment of the present disclosure.

FIG. 14A is a perspective view illustrating a first plating part 311 of a printed circuit board 201 in which a capacitor is embedded according to various embodiments ("a second embodiment") of the present disclosure. FIG. 14B is a perspective view illustrating a second plating part 321 of a printed circuit board 201 in which a capacitor is embedded according to another embodiment of the present disclosure;

Referring to FIGS. 14A to 14B, the capacitor 300 embedded in the printed circuit board 201 includes a plurality of first and second conductive layers 310 and 320 and a plurality of dielectric layers (not illustrated).

The first conductive layers 310 are arranged along a longitude direction, and the first conductive layers 210 may be arranged between the second conductive layers 320, which will be described below, and the first conductive layers 210 and the second conductive layers 320, which will be described below, may be alternately arranged in turns. The first plating part 311 may be formed on side surfaces of the first conductive layers 310 to electrically connect the first conductive layers 310.

The second conductive layers 320 are arranged along a longitude direction, and the second conductive layers 220 may be arranged between the first conductive layers 310 and the first conductive layers 310, and the second conductive layers 210 may be alternately arranged in turns. The second plating part 320 may be formed on side surfaces of the second conductive layers 320 to electrically connect the second conductive layers 321.

The dielectric layers (not illustrated) are provided between the first and second conductive layers 310 and 320 such that the first and second conductive layers 310 and 320 are not electrically connected to each other.

In this way, because the capacitor 200 is formed by alternately arranging the plurality of first and second conductive layers 310 and 320 having the plurality of first and second plating parts 311 and 321 in the printed circuit board 201 such that the first and second conducive layers 210 and 320 face each other, and the first and second plating parts 311 and 321 are formed on the side surfaces of the first and second conductive layers 310 and 320, the first and second conductive layers 310 and 320 are easily electrically connected to each other, an electric shock to the user can be prevented by preventing generation of an electric shock current of the electronic device by the capacitor 200, damage to the electronic component 201a provided in the printed circuit board 201 can be prevented by preventing generation of an electro-static discharge (ESD), and RF radiation characteristics can be improved by preventing the deterioration of the RF performance of an antenna unit 201b provided in the printed circuit board 201 as well.

The first and second conductive layers 311 and 321 may form a plating area and may be formed of a metal material.

One of the plurality of electronic components 201a is arranged at, and electrically connected to, the upper portions of the first and second conductive layers 310 and 320.

The electronic component 201a (see FIG. 8) may be an antenna clip that is electrically connected to the antenna unit 201b (see FIG. 8) provided in the electronic device 10 (see FIG. 1). Although the electronic component 201a (see FIG. 8) depicted is an antenna clip, it shall be understood that the present disclosure is not limited thereto. That is, another electronic component 201a may be provided in the printed circuit board 201 (see FIGS. 4 and 8). For example, the electronic component 201a may be a connector or a switch device.

The first and second conductive layers 310 and 320 and the first and second plating parts 311 and 321 may be formed of a metal material. Although the first and second conductive layers 310 and 320 and the first and second plating parts 311 and 321 are shown to be formed of a metal material, the present disclosure is not limited thereto. The first and second conductive layers 310 and 320 and the first and second plating parts 311 and 321 may be variously formed of any material that is electrically conductive, other than a metal material.

The first and second conductive layers 310 and 320 and the first and second plating parts 311 and 321 may be electrically connected to any one of a plurality of signal wires and a plurality of grounds.

A process of manufacturing the printed circuit board in which the capacitor 200 is embedded will be described with reference to FIGS. 14A and 14B as follows.

First, as illustrated in FIG. 14A, the first conductive layer 310 having the first plating part 311 on a side surface thereof is formed, and as illustrated in FIG. 14B, the second conductive layer 320 having the second plating part 321 on a side surface thereof is formed.

As illustrated in FIGS. 14A and 14B, another first conductive layer 310 is placed planarly above the second conductive layer 320, and another second conductive layer 320 is arranged on the another first conductive layer 310.

Then, the other second conductive layer 320 and the other first conductive layer 310 are alternately arranged in turns to face each other. That is, a second conductive layer 320 is placed planarly above a first conductive layer 310, another first conductive layer 310 is arranged on the second conductive layer 320, and another second conductive layer 320 is sequentially alternately arranged in the longitude direction of another second conductive layer 220.

Another first conductive layer 310 is placed planarly above the second conductive layer 320, and another second conductive layer 320 is arranged on the other first conductive layer 310 in the longitude direction. Accordingly, the second conductive layers 320 that are arranged between the first conductive layers 310 and the first plating part 311 formed on the side surfaces of the first conductive layers 311 electrically connect the first conductive layers 310 at the same time, and the second plating part 321 that is formed on the side surfaces of the second conductive layers 321 electrically connect the second conductive layer 320.

Ten layers may be arranged such that the first and second conductive layers 310 and 320 are alternately arranged in turns to face each other. More or less than ten layers of the first and second conductive layers 310 and 320 may be arranged.

Dielectric layers (not illustrated) are formed between the first and second conductive layers 310 and 320 to prevent the first and second conductive layers 310 and 320 from being electrically connected to each other.

That is, the dielectric layers 230 prevent electrical connection between any one of the first conductive layers 210 and any one of the second conductive layers 220.

According to various embodiments of the present disclosure, an operation of the capacitor 300 embedded in the printed circuit board will be described as follows.

The antenna clip 201a (see FIG. 8) is installed on the capacitor 300 embedded in the printed circuit board 201 (see FIGS. 4 and 8). Then, the antenna clip 201a is electrically connected to the first conductive layer 310 installed on the capacitor 300 (see FIGS. 14A and 14B). Here, if the second conductive layer 320 is arranged on the capacitor 300, the antenna clip 201a is electrically connected to the second conductive layer 320 by a wire. Here, an embodiment in which the antenna clip is electrically connected to the first and second conductive layers 310 and 320 will be described.

The antenna clip 201a (see FIG. 8) may be electrically connected to the antenna unit 201b (see FIG. 8) provided in the electronic device 10 (see FIG. 1).

That is, the antenna clip is electrically connected to the first and second plating parts 311 and 321 of the first and second conductive layers 310 and 320. Through this configuration, the first and second conductive layers 310 and 320 are connected to each other by the first and second plating parts 311 and 321, respectively.

The first and second plating parts 311 and 321 may reduce the magnitude of the currents that flow through the first and second conductive layers 310 and 320, and the first and second plating parts 311 and 321 reduce parasitic inductance caused by the currents. Accordingly, an electro-static (ESD) that may be generated in the printed circuit board 201 and the antenna clip can be prevented. Moreover, because the first and second conductive layers 310 and 320 reduce the magnitude of the current that flows in the printed circuit board 201, an electric shock current can be prevented.

Furthermore, the capacitance of the printed circuit board 201 can be enhanced by making the areas of the first and second conductive layers 310 and 320 larger, making the interval between the first and second conductive layers 310 and 320 shorter, and alternately arranging the first and second conductive layers 210 and 220. The first and second conductive layers 310 and 320 increase capacitance to provide a necessary electrical capacitance for the antenna clip, and accordingly, can improve an operation of the antenna unit 201 (see FIGS. 4 and 8) of the antenna clip 201b (see FIGS. 4 and 8). The first and second conductive layers 310 and 320 can improve the RF radiation characteristics of the antenna unit.

Figure 15A:
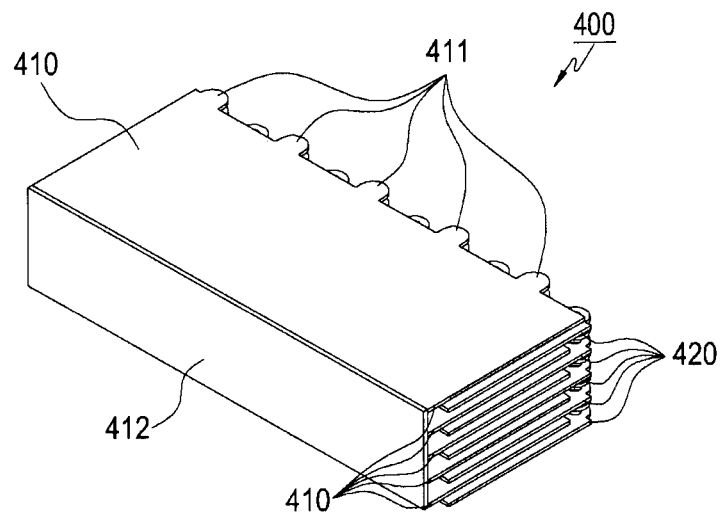
FIG. 15A is a perspective view illustrating a first via hole and a plating part of a printed circuit board in which a capacitor is embedded according to another embodiment of the present disclosure.
Figure 15B:
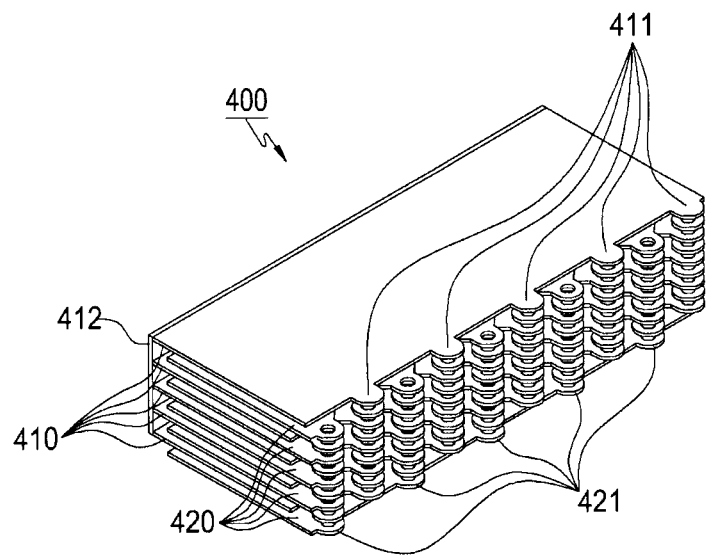
FIG. 15B is a perspective view illustrating first and second via holes and a plating part of a printed circuit board in which a capacitor is embedded according to another embodiment of the present disclosure.

FIG. 15A is a perspective view illustrating first and second via holes 411 and 412 of a printed circuit board 201 in which a capacitor 400 is embedded according to various embodiments ("a third embodiment") of the present disclosure. FIG. 15B is a perspective view illustrating a plating part 412 of a printed circuit board 201 in which a capacitor 400 is embedded according to another embodiment of the present disclosure;

Referring to FIGS. 15A to 15B, the capacitor 400 embedded in the printed circuit board 201 (see FIGS. 4 and 8) includes a plurality of first and second conductive layers 410 and 420 and a plurality of dielectric layers (not illustrated).

The first conductive layers 410 are arranged along a longitude direction, and the first conductive layers 210 may be arranged between the second conductive layers 420, which will be described below, and the first conductive layers 210 and the second conductive layers 420 may be alternately arranged in turns. A plurality of first via holes 411 are formed on one side of the first conductive layers 410 to electrically connect the first conductive layers 410, and the plating part 412 is formed on an opposite side of the first conductive layers 410 to electrically connect the first conductive layers 410.

The second conductive layers 420 are arranged along a longitude direction, and the second conductive layers 220 may be arranged between the first conductive layers 410 and the first conductive layers 410, and the second conductive layers 210 may be alternately arranged in turns. A plurality of second via holes 421 may be formed on one side of the second conductive layers 420 to electrically connect the second conductive layers 421.

The dielectric layers (not illustrated) are provided between the first and second conductive layers 410 and 420 to prevent any one of the first conductive layers 410 from forming an electrical connection with any one of the second conductive layers 420.

In this way, because the capacitor 400 is formed by alternately arranging the plurality of first and second conductive layers 410 and 420 in the interior of the printed circuit board 201 (see FIGS. 4 and 8) such that the first and second conductive layers 410 and 420 face each other, the plurality of via holes 411 are formed on one side of the first conductive layer 410, the plating part 412 is formed on an opposite side of the first conductive layer 410, and the plurality of second via holes 421 are formed on one side of the second conductive layer 420, an electrical connection of the first and second conductive layers 410 and 420 can be further enhanced, an electric shock to the user can be prevented by preventing an electric shock current of the electronic device by the capacitor 400, damage to the electronic component 201a provided in the printed circuit board 201 can be prevented by interrupting an electro-static discharge (ESD), and the RF radiation characteristics can be enhanced by preventing deterioration of the RF performance of the antenna unit provided in the printed circuit board 201.

The first and second conductive layers 410 and 420 and the plating part 412 may be formed of a metal material. Although the first and second conductive layers 410 and 420 and the plating part 412 are described as formed of a metal material, the present disclosure is not limited thereto. The first and second conductive layers 410 and 420 and the plating part 412 may be variously formed of any material that is electrically conductive, other than a metal material.

The first and second conductive layers 410 and 420 and the plating part 412 may be electrically connected to any one of a plurality of signal wires 2012 (see FIGS. 4 and 5) and a plurality of grounds.

The first and second via holes 411 and 421 may be formed along one side surface of the first and second conductive layers 410 and 420, and the first and second via holes 411 and 421 may be arranged in spaces formed between the first and second via holes 411 and 421.

For example, as illustrated in FIGS. 13A and 13b, which have been mentioned above, the first and second conductive layers 410 and 420 are arranged in a longitude direction. Then, because the plurality of first via holes 410 are formed on one side of the first conductive layer 411 and the spaces are formed between the first via holes 411, the second via holes 420 formed on one side of the second conductive layer 421 are arranged in the spaces 211a of the first via holes 211. Similarly, because spaces are formed between the second via holes 421 of the second conductive layer 420, the first via holes 411 of the first conductive layer 410 are arranged in the spaces of the second via holes 421. The plating part is formed on an opposite side of the first conductive layer 410.

Accordingly, only the first conductive layers 410 are electrically connected to each other by the first via holes 411 and the plating part 412, and only the second conductive layers 420 are electrically connected to each other by the second via holes 421.

Hereinafter, a process of manufacturing the printed circuit board 201 in which the capacitor 400 is embedded will be described with reference to FIGS. 15A and 15B, which have been mentioned above.

First, as illustrated in FIG. 15A, the first conductive layers 411 having the plurality of first via holes 410 and the plating part 412 are formed on the opposite side surfaces of the printed circuit board 201, and as illustrated in FIG. 15B, the second conductive layers 420 are formed on the first conductive layers 210 in the longitude direction. A plurality of second via holes 420 are formed on one side surface of the second conductive layers 421. Then, the second via holes 421 are arranged in the spaces formed between the first via holes 410 of the first conductive layer 411. Similarly, the first via holes 421 are arranged in the spaces formed between the second via holes 411.

As illustrated in FIGS. 15A and 15B, another first conductive layer 410 is placed planarly above the second conductive layer 420, and another second conductive layer 420 is arranged on the another first conductive layer 410.

Then, the other second conductive layer 420 and the other first conductive layer 410 are alternately arranged in turns to face each other. That is, a second conductive layer 420 is placed planarly above a first conductive layer 410, another first conductive layer 410 is arranged on the second conductive layer 420, and another second conductive layer 420 is sequentially alternately arranged in the longitude direction of another second conductive layer 420.

Similarly, another first conductive layer 410 is placed planarly above the second conductive layer 420, and another second conductive layer 420 is arranged on the another first conductive layer 410 in the longitude direction. Accordingly, the second conductive layers 420 are arranged between the first conductive layers 410 and the first via holes 411 and the plating part 410 that is formed on the opposite side surfaces of the first conductive layers 411 electrically connect the first conductive layers 410 at the same time, and the second via holes 422 of the second conductive layers 421 electrically connect the second conductive layer 420.

Ten layers may be arranged such that the first and second conductive layers 410 and 420 are alternately arranged in turns to face each other. More than or less than ten layers of the first and second conductive layers 410 and 420 may be arranged.

Dielectric layers (not illustrated) are formed between the first and second conductive layers 410 and 420 to prevent the first and second conductive layers 410 and 420 from being electrically connected to each other.

The antenna clip 201a (see FIGS. 4 and 8) is installed on the capacitor 400 embedded in the printed circuit board 201 (see FIGS. 4 and 8). Then, the antenna clip is electrically connected to the first conductive layer 410 installed on the capacitor 400. Here, if the second conductive layer 420 is arranged on the capacitor 400, the antenna clip is electrically connected to the second conductive layer 420.

Here, an embodiment in which the antenna clip 201a (see FIGS. 4 and 8) is electrically connected to the first and second conductive layers 410 and 420 will be described.

The antenna clip 201a (see FIGS. 4 and 8) may be electrically connected to the antenna unit 201b (see FIGS. 4 and 8) provided in the electronic device 10 (see FIG. 1).

That is, the antenna clip 201b (see FIGS. 4 and 8) is electrically connected to the opposite side surfaces of the first conductive layer 410 by the first via hole 411 and the plating part 412, and is electrically connected to one side surface of the second conductive layer 420 by the second via hole 421.

The first and second via holes 411 and 421 and the plating part 412 are arranged adjacent to each other and may reduce the magnitude of the currents that flow through the first and second conductive layers 410 and 420, and the first and second via holes 411 and 421 and the plating part 412 reduce parasitic inductance due to the currents. Accordingly, an electro-static discharge that may be generated in the printed circuit board 201 (see FIGS. 4 and 8) and the antenna clip 201a (see FIGS. 4 and 8) can be prevented. Moreover, because the first and second conductive layers 410 and 420 reduce the magnitude of the current that flows in the printed circuit board 201 (see FIGS. 4 and 8), an electric shock current can be prevented.

Furthermore, the capacitance of the printed circuit board 201 can be enhanced by making the areas of the first and second conductive layers 410 and 420 larger, making the interval between the first and second conductive layers 410 and 420 shorter, and alternately arranging the first and second conductive layers 210 and 220. The first and second plating layers 410 and 420 increase capacitance in order to provide a necessary electrical capacitance for the antenna clip, and accordingly, can improve an operation of the antenna unit 201 (see FIGS. 4 and 8) of the antenna clip 201b (see FIGS. 4 and 8). The first and second conductive layers 410 and 420 can improve the RF radiation characteristics of the antenna unit.

Figure 16A:
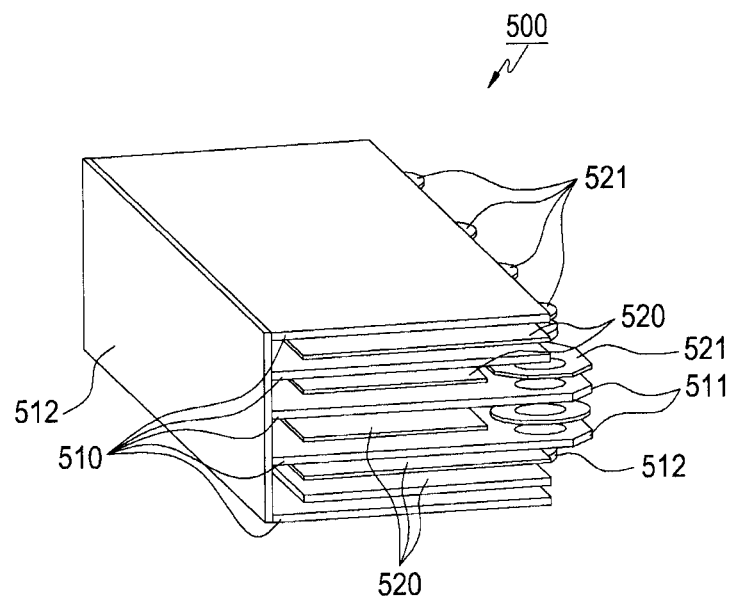
FIG. 16A is a perspective view illustrating a first via hole and a plating part of a printed circuit board in which a capacitor is embedded according to another embodiment of the present disclosure.
Figure 16B:
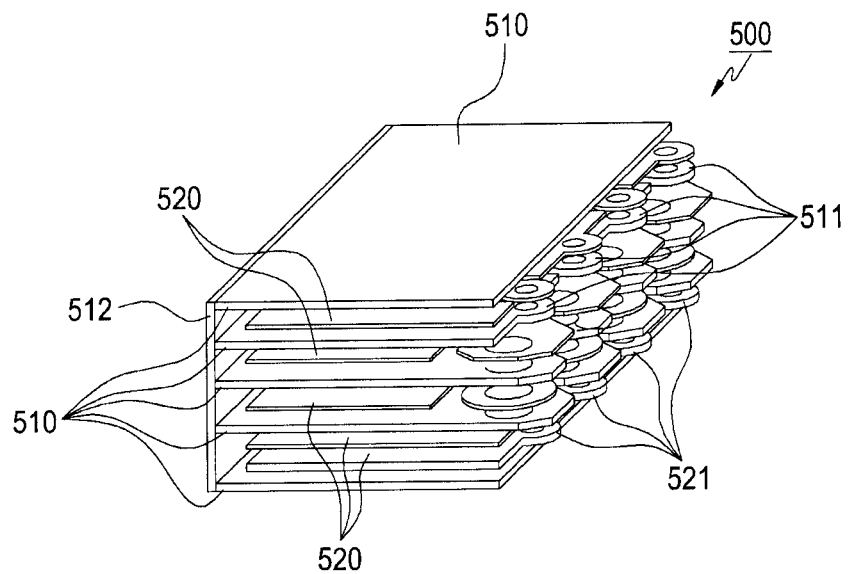
FIG. 16B is a perspective view illustrating first and second via holes and a plating part of a printed circuit board in which a capacitor is embedded according to another embodiment of the present disclosure.
Figure 16C:
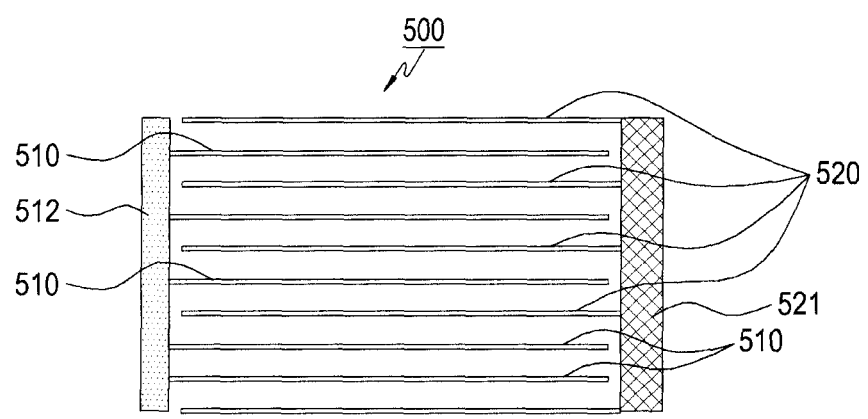
FIG. 16C is a side sectional view illustrating a first via hole and a plating part of a printed circuit board in which a capacitor is embedded according to another embodiment of the present disclosure.

FIG. 16A is a perspective view illustrating first and second via holes 512 and 412 and a plating part 512 of a printed circuit board 201 in which a capacitor 500 is embedded according to another embodiment ("a fourth embodiment") of the present disclosure. FIG. 16B is a perspective view illustrating first and second via holes 511 and 521 and a plating part 512 of a printed circuit board in which a capacitor 500 is embedded according to another embodiment of the present disclosure. FIG. 16C is a side sectional view illustrating a second via hole 521 and a plating part 512 of a printed circuit board in which a capacitor 500 is embedded according to another embodiment of the present disclosure.

Referring to FIGS. 16A to 16B, the capacitor embedded in the printed circuit board 201 (see FIGS. 4 and 8) includes a plurality of first and second conductive layers 510 and 520 and a plurality of dielectric layers (not illustrated).

The first conductive layers 510 are arranged along a longitude direction, and the first conductive layers 210 may be arranged between the second conductive layers 520, which will be described below, and the first conductive layers 210 and the second conductive layers 520 may be alternately arranged in turns or continuously arranged between the second conductive layers 520. A plurality of first via holes 510 are formed on one side of the first conductive layers 510 to electrically connect the first conductive layers 511, and the plating part 510 is formed on an opposite side of the first conductive layers 510 to electrically connect the first conductive layers 512.

The second conductive layers 520 are arranged along a longitude direction, and the second conductive layers 520 may be arranged between the first conductive layers 510 and the first conductive layers 210 and the second conductive layers 510 may be alternately arranged in turns or continuously arranged between the second conductive layers 510. The second conductive layers 520 may be continuously arranged between the first conductive layers 510. A plurality of second via holes 520 may be formed on one side of the second conductive layers 520 to electrically connect the second conductive layers 521.

The dielectric layers (not illustrated) are provided between the first and second conductive layers 510 and 520 such that the first and second conductive layers 510 and 520 are not electrically connected to each other.

In this way, the first conductive layers 510 and the second conductive layers 520 may be alternately arranged in turns. Other first conductive layers 510 may be continuously arranged on or under the first conductive layers 510 between the second conductive layers 520.

Similarly, the first conductive layers 510 and the second conductive layers 520 may be alternately arranged in turns, and other second conductive layers 520 may be continuously arranged on or under the second conductive layers 520 between the first conductive layers 510.

Because the first and second conductive layers 510 and 520 and the dielectric layer, which are arranged in this way, are configured in the interior of the printed circuit board 201 (see FIGS. 4 and 8), an electrical connection of the first and second conductive layers 510 and 520 can be further enhanced, an electric shock to the user can be prevented by preventing an electric shock current of the electronic device by the capacitor 400, damage to the electronic component 201a provided in the printed circuit board 201 can be prevented by interrupting an electro-static discharge (ESD), and the RF radiation characteristics can be enhanced by preventing the deterioration of the RF performance of the antenna unit provided in the printed circuit board 201

The first and second conductive layers 510 and 520 and the plating part 512 may be formed of a metal material. Although the first and second conductive layers 510 and 520 and the plating part 512 are depicted as formed of a metal material, the present disclosure is not limited thereto. The first and second conductive layers 510 and 520 and the plating part 512 may be variously formed of any material that is electrically conductive, other than a metal material.

The first and second conductive layers 510 and 520 and the plating part 512 may be electrically connected to any one of a plurality of signal wires 202 (see FIGS. 4 and 5) and a plurality of grounds.

The first and second via holes 511 and 521 may be formed along one side surface of the first and second conductive layers 510 and 520, and the first and second via holes 511 and 521 may be arranged in spaces formed between the first and second via holes 511 and 521.

For example, as illustrated in FIGS. 16A to 16C, which have been mentioned above, the first and second conductive layers 510 and 520 are arranged in a longitude direction. Then, because the plurality of first via holes 510 are formed on one side of the first conductive layer 511 and the spaces are formed between the first via holes 511, the second via holes 520 that are formed on one side of the second conductive layer 521 are arranged in the spaces of the first via holes 511. Furthermore, because spaces are formed between the second via holes 520 of the second conductive layer 521, the first via holes 510 of the first conductive layer 511 are arranged in the spaces of the second via holes 521. The plating part is formed on an opposite side of the first conductive layer 510.

Accordingly, only the first conductive layers 510 are electrically connected to each other by the first via holes 511 and the plating part 512, and only the second conductive layers 520 are electrically connected to each other by the second via holes 521.

Hereinafter, a process of manufacturing the printed circuit board in which the capacitor 500 is embedded will be described with reference to FIGS. 16A to 16C, which have been mentioned above.

First, as illustrated in FIG. 16C, the first conductive layers 511 having the plurality of first via holes 512 and the plating part 510 are formed on the opposite side surfaces of the printed circuit board, and as illustrated in FIG. 16B, the second conductive layers 520 are formed on the first conductive layers 510 in the longitude direction. The plurality of second via holes 521 are formed on one side surface of the second conductive layer 520, and another second conductive layer 520 is continuously formed on the second conductive layer 520. Then, the second via holes 521 are arranged in the spaces formed between the first via holes 510 of the first conductive layer 511. Similarly, the first via holes 521 are arranged in the spaces formed between the second via holes 511.

As illustrated in FIGS. 16A, 16B, and 16C, another second conductive layer 520 is continuously placed planarly above the second conductive layer 520, another first conductive layer 510 is placed planarly above the another second conductive layer 520, and another second conductive layer 520 is arranged on the other first conductive layer 510.

Furthermore, as illustrated in FIGS. 16A and 16B, another first conductive layer 510 is continuously placed planarly above the first conductive layer 510, another second conductive layer 520 is placed planarly above the other first conductive layer 510, and another first conductive layer 510 is arranged on the other second conductive layer 520. Then, the another second conductive layer 520 and the another first conductive layer 510 are alternately arranged in turns to face each other. That is, a second conductive layer 520 is placed planarly above a first conductive layer 510, another first conductive layer 510 is arranged on the second conductive layer 520, and another second conductive layer 520 is sequentially alternately arranged in the longitude direction of another second conductive layer 520.

Similarly, another first conductive layer 510 is placed planarly above the second conductive layer 520, and another second conductive layer 520 is arranged on the another first conductive layer 510 in the longitude direction. Accordingly, the second conductive layers 520 are arranged between the first conductive layers 510 and the first via holes 510 and the plating part 511 that are formed on the opposite side surfaces of the first conductive layers 512 electrically connect the first conductive layers 510 at the same time, and the second via holes 521 of the second conductive layers 520 electrically connect the second conductive layer 521.

Ten layers may be arranged such that the first and second conductive layers 510 and 520 are alternately arranged in turns to face each other. More than or less than ten layers of the first and second conductive layers 510 and 520 may be arranged.

Dielectric layers (not illustrated) are formed between the first and second conductive layers 510 and 520 to prevent the first and second conductive layers 510 and 520 from being electrically connected to each other.

That is, the dielectric layers (not illustrated) electrically connect only the first conductive layers 511 with the first via holes 512 and the plating part 510, and electrically connect only the second conductive layers 521 with the second via holes 520.

In this way, another first conductive layer 510 may be continuously arranged on the first conductive layer 510, and another second conductive layer 520 may be continuously arranged on the second conductive layer 520 at the same time.

A description of an operation of the capacitor 500 embedded in the printed circuit board 201 (see FIGS. 4 and 8) is the same as the description of the capacitor 200 (see FIG. 4) according to the prior embodiment of the present disclosure, and will be omitted.

Figure 17:
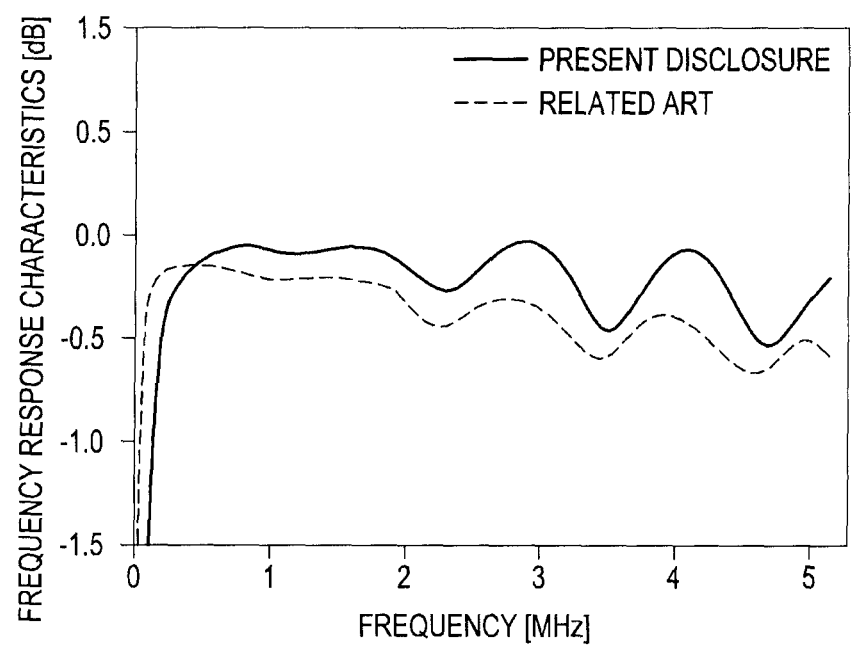
FIG. 17 is a graph depicting a frequency response characteristic result of a printed circuit board in which a capacitor is embedded according to various embodiments of the present disclosure.

According to various embodiments of the present disclosure, FIG. 17 is a graph depicting frequency response characteristics between a printed embedded capacitor 200, 300, 400, and 500 and an existing prevention cap (not illustrated). As illustrated in FIG. 17, it is shown that the frequency response characteristic curve of the present disclosure is improved by 0.5 dB or less. That is, the embedded capacitor 200, 300, 400, and 500 of the present disclosure increases the capacitance of the printed circuit board, and accordingly, the transfer characteristics of the frequency becomes excellent.

Accordingly, the capacitor 200, 300, and 400 embedded in the printed circuit board can prevent the generation of an electric shock current and an electro-static discharge (ESD) as compared with an existing prevention cap (not illustrated) installed outside a printed circuit board and can further improve RF radiation characteristics by preventing the deterioration of the RF performance of an antenna unit.

While the present disclosure has been shown and described with reference to certain embodiments thereof, it will be apparent to those skilled in the art that the capacitor according to the present disclosure is not limited to these embodiments, and various changes in form and details may be made therein without departing from the spirit and scope of the present disclosure as defined by the appended claims and equivalents thereof.

What is claimed is:

1. A printed circuit board on which a plurality of electronic components are mounted and in which a capacitor is embedded, the printed circuit board comprising:
   a plurality of first conductive layers that have a plurality of first via holes;
   a plurality of second conductive layers that have a plurality of second via holes, wherein two or more of the plurality of first conductive layers and two or more of the plurality of second conductive layers are alternately arranged in turn; and
   a plurality of dielectric layers that are arranged between the two or more first and two or more second conductive layers,
   wherein at least two additional ones of the plurality of first conductive layers are arranged adjacently between a first additional and second additional one of the plurality of second conductive layers, or at least two additional ones of the plurality of second conductive layers are arranged adjacently between a first additional and second additional one of the plurality of first conductive layers.

2. The printed circuit board of claim 1, wherein the capacitor in which one of the plurality of electronic components is arranged such that the capacitor is electrically connected to the electronic component is embedded on the first and second conductive layers.

3. The printed circuit board of claim 2, wherein the one of the plurality of electronic components is an antenna clip that is electrically connected to an antenna unit provided in an electronic device.

4. The printed circuit board of claim 3, wherein the antenna clip is any one of a C-clip, a plate spring, and a pogo spring.

5. The printed circuit board of claim 1, wherein the plurality of first and second conductive layers are formed of a metal material.

6. The printed circuit board of claim 1, wherein the plurality of first and second conductive layers are electrically connected to any one of a plurality of signal wires and a plurality of grounds.

7. The printed circuit board of claim 1, wherein the first via holes electrically connect the plurality of first conductive layers, and the second via holes electrically connect the plurality of second conductive layers.

8. The printed circuit board of claim 1, wherein a size of a surface of each of the dielectric layers is larger than sizes of the first and second conductive layers that face the surfaces of the dielectric layers.

9. The printed circuit board of claim 1, wherein the plurality of first and plurality of second via holes are arranged along opposite side surfaces of the first and second conductive layers.

10. The printed circuit board of claim 1, wherein the first via holes are arranged along opposite side surfaces of the plurality of first conductive layers, and the second via holes are arranged along a perimeter of the plurality of second conductive layers.

11. The printed circuit board of claim 1, wherein the first via holes are arranged along opposite side surfaces of the plurality of first conductive layers, and the second via holes are arranged along a vertical line and a horizontal line of the plurality of second conductive layers.

12. The printed circuit board of claim 1, wherein the plurality of first and the plurality of second via holes are arranged along a centers of the plurality of first and plurality of second conductive layers.

13. The printed circuit board of claim 1, wherein the plurality of first and the plurality of second via holes are arranged in the plurality of first and plurality of second conductive layers alternately in a transverse and vertical directions.

14. The printed circuit board of claim 13, wherein the plurality of first and the plurality of second via holes are arranged in a crossing configuration.

15. The printed circuit board of claim 1, wherein capacitors arranged in spaces formed between the plurality of first and the plurality of second via holes are embedded in the plurality of first and the plurality of second via holes.

16. A printed circuit board on which a plurality of electronic components are mounted and in which a capacitor is embedded, the printed circuit board comprising:
   a plurality of first conductive layers;
   a plurality of second conductive layers; and
   a plurality of dielectric layers that are arranged between the first and second conductive layers, and
   wherein two or more of the plurality of first conductive layers and two or more of the plurality of second conductive layers are alternately arranged in turn, and
   wherein at least two of the plurality of second conductive layers are adjacent and between a first one and a second one of the plurality of first plurality of conductive layers or at least two of the plurality of first conductive layers are adjacent and between a first one and a second one of the plurality of second conductive layers.

17. The printed circuit board of claim 16, wherein a plurality of first and second via holes that electrically connect the plurality of first and plurality of second conductive layers are formed on opposite sides of the plurality of first and plurality of second conductive layers.

18. The printed circuit board of claim 16, wherein:
   the at least two adjacent ones of the plurality of first conductive layers do not have an intervening second conductive layer; or
   the at least two adjacent ones of the plurality of second conductive layers do not have an intervening first conductive layer.

* * * * *